(12) United States Patent
Hakamata et al.

(10) Patent No.: US 12,421,343 B2
(45) Date of Patent: Sep. 23, 2025

(54) COMPOSITION FOR FORMING UNDERLAYER FILM FOR IMPRINTING, METHOD FOR PRODUCING COMPOSITION FOR FORMING UNDERLAYER FILM, KIT, PATTERN PRODUCING METHOD, AND METHOD FOR MANUFACTURING SEMICONDUCTOR ELEMENT

(71) Applicant: FUJIFILM Corporation, Tokyo (JP)

(72) Inventors: Akihiro Hakamata, Haibara-gun (JP); Yuichiro Goto, Haibara-gun (JP); Naoya Shimoju, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 1037 days.

(21) Appl. No.: 17/473,302

(22) Filed: Sep. 13, 2021

(65) Prior Publication Data

US 2021/0403630 A1    Dec. 30, 2021

Related U.S. Application Data

(63) Continuation of application No. PCT/JP2020/009901, filed on Mar. 9, 2020.

(30) Foreign Application Priority Data

Mar. 14, 2019    (JP) ................. 2019-047002

(51) Int. Cl.
*C08F 290/12*    (2006.01)
*B29C 59/02*    (2006.01)
(Continued)

(52) U.S. Cl.
CPC ........ *C08F 290/126* (2013.01); *B29C 59/026* (2013.01); *C08F 299/00* (2013.01);
(Continued)

(58) Field of Classification Search
CPC .. C08F 290/08; C08F 290/126; C08F 299/00; B29C 59/026; G03F 7/0002;
(Continued)

(56) References Cited

U.S. PATENT DOCUMENTS 9,169,412 B2 * 10/2015 Amao ................. C08F 222/385
2012/0128891 A1 * 5/2012 Takei .................... G03F 7/2051
522/170

(Continued)

FOREIGN PATENT DOCUMENTS

JP    2000-128783 A    5/2000
JP    2013-093552 A    5/2013
(Continued)

OTHER PUBLICATIONS

Office Action issued May 10, 2022 in Japanese Application No. 2021-505055.
(Continued)

*Primary Examiner* — Dale E Page
*Assistant Examiner* — Quovaunda Jefferson
(74) *Attorney, Agent, or Firm* — Sughrue Mion, PLLC

(57) ABSTRACT

Provided are: a composition for forming an underlayer film for imprinting, which contains a high-molecular-weight compound having a polymerizable group, a chelating agent, and a solvent, and a method for producing the same; a kit including the composition for forming an underlayer film; a pattern producing method using the composition for forming an underlayer film; and a method for manufacturing a semiconductor element, which includes the pattern producing method as a step.

16 Claims, 1 Drawing Sheet

(51) Int. Cl.
  *B29K 33/00* (2006.01)
  *B29K 707/00* (2006.01)
  *B29L 31/34* (2006.01)
  *C08F 299/00* (2006.01)
  *G03F 7/00* (2006.01)
  *H01L 21/027* (2006.01)

(52) U.S. Cl.
  CPC ........ *G03F 7/0002* (2013.01); *H01L 21/0271* (2013.01); *B29K 2033/08* (2013.01); *B29K 2707/00* (2013.01); *B29K 2995/0003* (2013.01); *B29L 2031/3406* (2013.01)

(58) Field of Classification Search
  CPC ............ H01L 21/0271; H01L 21/3081; B29K 2033/08; B29K 2707/00; B29K 2995/0003; B29L 2031/3406; C08K 5/09; C08L 101/00
  See application file for complete search history.

(56) References Cited

U.S. PATENT DOCUMENTS

| | | | |
|---|---|---|---|
| 2014/0220353 A1 | 8/2014 | Kodama et al. | |
| 2015/0014819 A1 | 1/2015 | Hattori et al. | |
| 2015/0293281 A1* | 10/2015 | Ezoe | C09D 7/45 359/359 |
| 2016/0009945 A1 | 1/2016 | Enomoto et al. | |

FOREIGN PATENT DOCUMENTS

| | | |
|---|---|---|
| JP | 2018-184564 A | 11/2018 |
| WO | 2011/013630 A1 | 2/2011 |
| WO | 2013/145829 A1 | 10/2013 |
| WO | 2014/157228 A1 | 10/2014 |
| WO | 2016/152600 A1 | 9/2016 |

OTHER PUBLICATIONS

Office Action issued Oct. 4, 2022 in Japanese Application No. 2021-505055.
International Search Report dated May 19, 2020 in Application No. PCT/JP2020/009901.
Written Opinion of the International Searching Authority dated May 19, 2020 in Application No. PCT/JP2020/009901.
International Preliminary Report on Patentability dated Aug. 25, 2021 with a Translation of the Written Opinion of the International Searching Authority in Application No. PCT/JP2020/009901.

* cited by examiner

COMPOSITION FOR FORMING UNDERLAYER FILM FOR IMPRINTING, METHOD FOR PRODUCING COMPOSITION FOR FORMING UNDERLAYER FILM, KIT, PATTERN PRODUCING METHOD, AND METHOD FOR MANUFACTURING SEMICONDUCTOR ELEMENT

CROSS-REFERENCE TO RELATED APPLICATIONS

This application is a Continuation of PCT International Application No. PCT/JP2020/009901 filed on Mar. 9, 2020, which claims priority under 35 U.S.C § 119(a) to Japanese Patent Application No. 2019-047002 filed on Mar. 14, 2019. Each of the above application(s) is hereby expressly incorporated by reference, in its entirety, into the present application.

BACKGROUND OF THE INVENTION

1. Field of the Invention

The present invention relates to a composition for forming an underlayer film for imprinting, a method for producing a composition for forming an underlayer film, and a kit. Moreover, the present invention relates to a pattern producing method using the composition for forming an underlayer film, and a pattern obtained by the producing method. Furthermore, the present invention relates to a method for manufacturing a semiconductor element, which includes the pattern producing method as a step.

2. Description of the Related Art

An imprinting method is a technique in which a fine pattern is transferred to a material by pressing a metal mold (generally called a mold or a stamper) on which a pattern is formed. The imprinting method enables simple and precise production of a fine pattern, and thus is expected to be applied in various fields in recent years. In particular, a nanoimprint technique for forming a fine pattern of a nano-order level is attracting attention.

The imprinting method is roughly classified into a thermal imprinting method and an optical imprinting method according to a transfer method thereof. In the thermal imprinting method, a mold is pressed against a thermoplastic resin heated to a temperature equal to or higher than a glass transition temperature (hereinafter, referred to as a "Tg" in some cases), the thermoplastic resin is cooled, and then the mold is released to form a fine pattern. This method has an advantage that various resin materials can be selected, but also has problems in that a high pressure is required during pressing, and as the pattern size is finer, the dimensional accuracy is likely to be reduced due to thermal shrinkage or the like. Meanwhile, in the optical imprinting method, after photocuring is performed in a state where a mold is pressed against a curable composition, the mold is released. In this method, high-pressure application or high-temperature heating is not required, a dimensional change before and after curing is small, and thus there is an advantage that a fine pattern can be formed with high accuracy.

In such an imprinting method, the mold is released from the curable composition, and thus adhesiveness between a substrate and the curable composition, which is sufficient to withstand the releasing operation, is required. Accordingly, for example, as shown in JP2013-093552A, a technique for providing, between a substrate and a curable composition, an underlayer film for improving the adhesiveness between the substrate and the curable composition has been proposed.

SUMMARY OF THE INVENTION

The technique for providing an underlayer film has brought about a certain improvement in the pattern formation by the imprinting method. However, here, it was found that in a case where an underlayer film is formed, metal components in the composition for forming an underlayer film are aggregated to form fine particles, and the fine particles may cause damage to the mold in a case where the mold is pressed against the substrate.

The present invention has been made in consideration of the aforementioned problems, and an object of the present invention is to provide a composition for forming an underlayer film for imprinting with which damage to a mold can be suppressed in a case where the mold is pressed, and a method for producing the same.

Moreover, another object of the present invention is to provide a kit including the composition for forming an underlayer film. Furthermore, still another object of the present invention is to provide a pattern producing method using the composition for forming an underlayer film, and a method for manufacturing a semiconductor element, which includes the pattern producing method as a step.

The aforementioned problems can be solved by adding a chelating agent to a composition for forming an underlayer film. Specifically, the aforementioned problems can be solved by the following unit <1> and preferably by a unit <2> and subsequent units.

<1>
A composition for forming an underlayer film for imprinting, comprising:
a high-molecular-weight compound having a polymerizable group;
a chelating agent; and
a solvent.
<2>
The composition for forming an underlayer film as described in <1>, in which the chelating agent has an acid group.
<3>
The composition for forming an underlayer film as described in <2>, in which the acid group includes a carboxy group.
<4>
The composition for forming an underlayer film as described in any one of <1> to <3>, in which the chelating agent has a ring structure.
<5>
The composition for forming an underlayer film as described in any one of <1> to <4>, in which a molecular weight of the chelating agent is 100 to 500.
<6>
The composition for forming an underlayer film as described in any one of <1> to <5>, in which the chelating agent contains a compound represented by Formula (CL1).

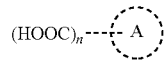

Formula (CL1)

In Formula (CL1), A represents a ring structure, and n represents an integer of 1 to 10.

<7>

The composition for forming an underlayer film as described in any one of <1> to <6>, in which a content of the chelating agent is 10 to 10,000 ppm by mass with respect to a solid content in the composition.

<8>

The composition for forming an underlayer film as described in any one of <1> to <7>, in which a content of the solvent is 99.0% by mass or greater with respect to the composition.

<9>

The composition for forming an underlayer film as described in any one of <1> to <8>, further comprising:
an acidic compound having a pKa of 6 or less, other than the chelating agent.

<10>

The composition for forming an underlayer film as described in <9>, in which the acidic compound other than the chelating agent is aromatic sulfonic acid.

<11>

The composition for forming an underlayer film as described in any one of <1> to <10>, in which the high-molecular-weight compound has a partial structure corresponding to a residue of the chelating agent.

<12>

The composition for forming an underlayer film as described in any one of <1> to <11>, in which the high-molecular-weight compound has a polar group.

<13>

A method for producing a composition for forming an underlayer film for imprinting, comprising:
filtering a composition, which contains a high-molecular-weight compound having a polymerizable group, a chelating agent, and a solvent, with a filter.

<14>

A kit for imprinting, comprising:
the composition for forming an underlayer film as described in any one of <1> to <12>; and
a curable composition.

<15>

A pattern producing method comprising:
forming an underlayer film on a substrate by using the composition for forming an underlayer film as described in any one of <1> to <12>;
applying a curable composition onto the underlayer film;
curing the curable composition in a state of being in contact with a mold; and
peeling off the mold from the curable composition.

<16>

The pattern producing method as described in <15>, in which the forming of the underlayer film includes applying the composition for forming an underlayer film onto the substrate by a spin coating method.

<17>

The pattern producing method as described in <15> or <16>, in which preserving the composition for forming an underlayer film at 10° C. to 40° C. before application onto the substrate is included.

<18>

The pattern producing method as described in any one of <15> to <17>, in which the curable composition is applied onto the underlayer film by an ink jet method.

<19>

A method for manufacturing a semiconductor element, in which a semiconductor element is manufactured using a pattern obtained by the producing method as described in any one of <15> to <18>.

By using the composition for forming an underlayer film or the method for producing the same according to an aspect of the present invention, damage to the mold during use can be suppressed.

DESCRIPTION OF THE PREFERRED EMBODIMENTS

Figure 1A:
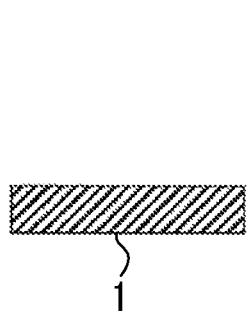
FIGS. 1A to 1G are schematic cross-sectional diagrams showing steps of imprinting.

Hereinafter, representative embodiments of the present invention will be described. Respective constituent elements will be described based on the representative embodiments for convenience, but the present invention is not limited to such embodiments.

In the present specification, a numerical range expressed using the term "to" means a range which includes the preceding and succeeding numerical values of "to" as a lower limit value and an upper limit value, respectively.

In the present specification, the term "step" is meant to include not only an independent step, but also a step which cannot be clearly distinguished from other steps as long as an intended action of the step is achieved.

In the description of a group (atomic group) in the present specification, in a case where the group is described without specifying whether the group is substituted or unsubstituted, the description means that the group includes both a group having no substituent and a group having a substituent. For example, in a case where a group is simply described as an "alkyl group", the description means that the alkyl group includes both an alkyl group having no substituent (unsubstituted alkyl group) and an alkyl group having a substituent (substituted alkyl group). Moreover, in a case where a group is simply described as an "alkyl group", the description means that the alkyl group may be chain-like or cyclic, and may be linear or branched in a case where the alkyl group is chain-like.

In the present specification, "light" includes not only light having a wavelength in an ultraviolet, near-ultraviolet, far-ultraviolet, visible, or infrared range, or an electromagnetic wave but also radiation. Examples of the radiation include a microwave, an electron beam, an extreme ultraviolet ray (EUV), and an X-ray. Moreover, laser light such as a 248-nm excimer laser, a 193-nm excimer laser, and a 172-nm excimer laser can also be used. The light may be monochromatic light (single-wavelength light) passing through an optical filter, or may be light (composite light) including a plurality of wavelengths.

In the present specification, "(meth)acrylate" means both "acrylate" and "methacrylate" or either of them, "(meth)acryl" means both "acryl" and "methacryl" or either of them, and "(meth)acryloyl" means both "acryloyl" or "methacryloyl" or either of them.

In the present specification, a solid content in a composition means components other than the solvent, and a concentration of the solid content in the composition is represented by the mass percentage of the components other than the solvent with respect to the total mass of the composition.

In the present specification, a temperature is 23° C. and an atmospheric pressure is 101,325 Pa (1 atm), unless otherwise specified.

In the present specification, a weight-average molecular weight (Mw) and a number-average molecular weight (Mn) are each expressed as a value in terms of polystyrene according to gel permeation chromatography (GPC measurement), unless otherwise specified. The weight-average molecular weight (Mw) and the number-average molecular weight (Mn) can be determined, for example, by using HLC-8220 (manufactured by TOSOH CORPORATION), and, as columns, GUARD COLUMN HZ-L, TSKgel Super HZM-M, TSKgel Super HZ4000, TSKgel Super HZ3000, and TSKgel Super HZ2000 (manufactured by TOSOH CORPORATION). Moreover, the measurement is performed using tetrahydrofuran (THF) as an eluent, unless otherwise specified. Furthermore, for the detection in the GPC measurement, a detector of ultraviolet rays (UV rays) having a wavelength of 254 nm is used, unless otherwise specified.

In the present specification, "imprint" preferably refers to transfer of a pattern with a size of 1 nm to 10 mm, and more preferably refers to transfer (nanoimprint) of a pattern with a size of about 10 nm to 100 μm.

In the present specification, regarding a positional relationship of respective layers constituting a laminate, in a case where there is a description of "upper" or "lower", another layer may be on an upper side or a lower side of a reference layer among a plurality of layers of interest. That is, a third layer or element may be further interposed between the reference layer and the other layer, and the reference layer and the other layer are not necessary to be in contact with each other. Moreover, unless otherwise specified, in a case where a direction in which layers are stacked on a base material or a substrate is referred to as "upward" or there is a photosensitive layer, a direction from the base material or the substrate to the photosensitive layer is referred to as "upward", and the opposite direction is referred to as "downward". Furthermore, such setting of upward and downward directions is for convenience in the present specification, and in a practical aspect, the "upward" direction in the present specification may be different from a vertically upward direction.

<Composition for Forming Underlayer Film>

The composition for forming an underlayer film for imprinting according to an embodiment of the present invention contains a high-molecular-weight compound having a polymerizable group, a chelating agent, and a solvent.

In a case where metal components in the composition for forming an underlayer film are contained, the metal components are aggregated to form fine particles, which cause damage to the mold in a case where the mold is pressed in some cases. In a case where the composition for forming an underlayer film according to the embodiment of the present invention contains a chelating agent, such damage to the mold can be suppressed. It is presumed that this is because the chelating agent captures the metal components contained in the composition and suppresses the aggregation and particle formation of the metal components. Moreover, it is presumed that as a result, the generation of metallic particles, which can cause damage to the mold, in the underlayer film can be suppressed.

Hereinafter, each component of the composition for forming an underlayer film according to the embodiment of the present invention will be described in detail.

<<High-Molecular-Weight Compound Having Polymerizable Group>>

In the composition for forming an underlayer film according to the embodiment of the present invention, the high-molecular-weight compound having a polymerizable group is usually a component having the highest content in the underlayer film, the type of the high-molecular-weight compound is not particularly limited, and well-known high-molecular-weight compounds can be widely used.

Examples of the high-molecular-weight compound include a (meth)acrylic resin, a vinyl resin, a novolac resin, an epoxy resin, a polyurethane resin, a phenol resin, a polyester resin, and a melamine resin, and at least one kind of a (meth)acrylic resin, a vinyl resin, or a novolac resin is preferable.

In the present invention, a weight-average molecular weight of the high-molecular-weight compound is preferably 4,000 or greater, more preferably 6,000 or greater, and still more preferably 10,000 or greater. The upper limit thereof is preferably 70,000 or less and may be 50,000 or less. A method for measuring the molecular weight is as described above. In a case where the weight-average molecular weight is 4,000 or greater, film stability during a heating treatment is improved, which leads to the improvement in a surface condition during the formation of the underlayer film. Moreover, in a case where the weight-average molecular weight is 70,000 or less, the solubility in a solvent is improved, and the spin coat application and the like are easily performed.

The polymerizable group of the high-molecular-weight compound is more preferably a group having an ethylenically unsaturated bond, an amino group, an isocyanate group, an epoxy group (oxirane group), and a hydroxyl group. Examples of the group having an ethylenically unsaturated bond include a (meth)acryloyl group (preferably, a (meth)acryloyloxy group and a (meth)acryloylamino group), a vinyl group, a vinyloxy group, an allyl group, a methylallyl group, a propenyl group, a butenyl group, a vinylphenyl group, and a cyclohexenyl group, and a (meth)acryloyloxy group and a vinyl group are preferable. In a case where the high-molecular-weight compound has a plurality of polymerizable groups, the underlayer film forms a crosslinking structure, aggregation breakage of the underlayer film in a case of releasing is prevented, and adhesiveness between the substrate and the curable composition which are provided on both sides of the underlayer film, respectively, can be ensured.

The high-molecular-weight compound preferably has a polar group in order to cause the adhesiveness to the substrate to be firm, and further to promote an interaction with the chelating agent. Specific examples of the polar group include a hydroxyl group, a carboxy group, an amide group, an imide group, a urea group, a urethane group, a cyano group, an ether group (preferably, a polyalkyleneoxy group), a cyclic ether group, a lactone group, a sulfonyl group, a sulfo group, a sulfonic acid group, a sulfonamide group, a sulfonimide group, a phosphoric acid group, a phosphate group, and a nitrile group. Among them, in particular, the polar group is preferably a sulfonyl group, a sulfo group, a sulfonic acid group, a sulfonamide group, a sulfonimide group, a phosphoric acid group, a phosphate group, a nitrile group, a carboxy group, an amino group, and a hydroxyl group, and more preferably a carboxy group and a hydroxyl group.

The high-molecular-weight compound preferably contains a polymer having at least one of constitutional units represented by Formulae (1) to (3).

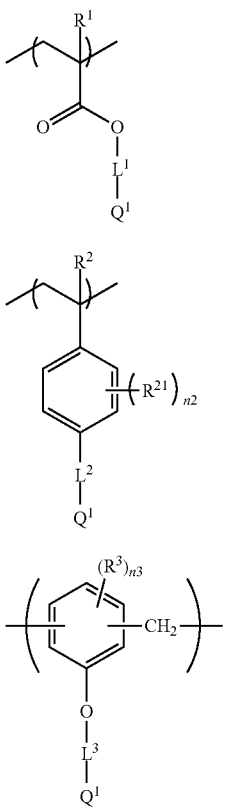

(1)

(2)

(3)

In the formulae, $R^1$ and $R^2$ are each independently a hydrogen atom or a methyl group. $R^{21}$ and $R^3$ are each independently a substituent T which will be described later. n2 is an integer of 0 to 4. n3 is an integer of 0 to 3.

$L^1$, $L^2$, and $L^3$ are each independently a single bond, or a linking group L which will be described later. Among them, a single bond, or an alkylene group or an (oligo)alkyleneoxy group, which is defined as the linking group L, is preferable. Here, the presence or absence of an oxygen atom at a terminal of the (oligo)alkyleneoxy group may be adjusted according to a structure of a preceding group. In the present specification, the "(oligo)alkyleneoxy group" means a divalent linking group having one or more "alkyleneoxy" constitutional units. The number of carbon atoms in an alkylene chain in the constitutional unit may be the same or different for every constitutional units.

$Q^1$ is a functional group of the high-molecular-weight compound, and examples thereof include the examples of the polymerizable group of the high-molecular-weight compound.

In a case where there are a plurality of $R^{21}$'s, $R^{21}$'s may be linked to each other to form a ring structure. In the present specification, the linking is meant to include not only an aspect in which groups are continued by bonding but also an aspect in which groups lose some atoms and are fused (condensed). Moreover, unless otherwise specified, in a case of the linking, an oxygen atom, a sulfur atom, and a nitrogen atom (amino group) may be interposed. Examples of the formed ring structure include an aliphatic hydrocarbon ring (the ring is referred to as a ring Cf) (for example, a cyclopropane ring, a cyclobutane ring, a cyclopentane ring, a cyclohexane ring, a cyclopropene ring, a cyclobutene ring, a cyclopentene ring, a cyclohexene ring, and the like), an aromatic hydrocarbon ring (the ring is referred to as a ring Cr) (a benzene ring, a naphthalene ring, an anthracene ring, a phenanthrene ring, and the like), a nitrogen-containing heterocyclic ring (the ring is referred to as a ring Cn) (for example, a pyrrole ring, an imidazole ring, a pyrazole ring, a pyridine ring, a pyrroline ring, a pyrrolidine ring, an imidazolidine ring, a pyrazolidine ring, a piperidine ring, a piperazine ring, a morpholine ring, and the like), an oxygen-containing heterocyclic ring (the ring is referred to as a ring Co) (a furan ring, a pyran ring, an oxirane ring, an oxetane ring, a tetrahydrofuran ring, a tetrahydropyran ring, a dioxane ring, and the like), and a sulfur-containing heterocyclic ring (the ring is referred to as a ring Cs) (a thiophene ring, a thiirane ring, a thietane ring, a tetrahydrothiophene ring, a tetrahydrothiopyran ring, and the like).

In a case where there are a plurality of $R^3$'s, $R^3$'s may be linked to each other to form a ring structure. Examples of the formed ring structure include the ring Cf, the ring Cr, the ring Cn, the ring Co, and the ring Cs.

The high-molecular-weight compound may be a copolymer having a constitutional unit other than the constitutional units represented by Formulae (1) to (3). Examples of the other constitutional unit include the following (11), (21), and (31). In the high-molecular-weight compound, the constitutional unit (11) is preferably combined with the constitutional unit (1), the constitutional unit (21) is preferably combined with the constitutional unit (2), and the constitutional unit (31) is preferably combined with the constitutional unit (3).

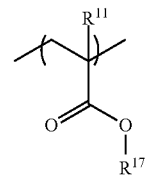

(11)

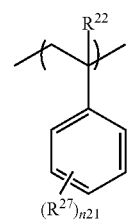

(21)

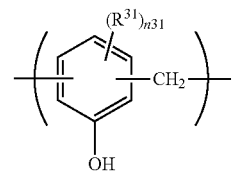

(31)

In the formulae, $R^{11}$ and $R^{22}$ are each independently a hydrogen atom or a methyl group. $R^{31}$ is the substituent T which will be described later, and n31 is an integer of 0 to 3. In a case where there are a plurality of $R^{31}$'s, $R^{31}$'s may be linked to each other to form a ring structure. Examples of the formed ring structure include examples of the ring Cf, the ring Cr, the ring Cn, the ring Co, and the ring Cs.

$R^{17}$ is an organic group, which forms an ester structure with a carbonyloxy group in the formula, or a hydrogen atom. The organic group is an alkyl group (the number of carbon atoms is preferably 1 to 24, more preferably 1 to 12, and still more preferably 1 to 6; and the alkyl group may be chain-like or cyclic, or may be linear or branched), an aryl group (the number of carbon atoms is preferably 6 to 22, more preferably 6 to 18, and still more preferably 6 to 10), an arylalkyl group (the number of carbon atoms is preferably 7 to 23, more preferably 7 to 19, and still more preferably 7 to 11; and the alkyl group moiety may be chain-like or cyclic, or may be linear or branched), a group consisting of an aromatic heterocyclic ring in which an oxygen atom in the formula is bonded to a carbon atom (in terms of ring structure, a pyrrole ring, an imidazole ring, a pyrazole ring, a pyridine ring, a furan ring, a thiophene ring, a thiazole ring, an oxazole ring, an indole ring, a carbazole ring, and the like), or a group consisting of an aliphatic heterocyclic ring in which an oxygen atom in the formula is bonded to a carbon atom (in terms of ring structure, a pyrroline ring, a pyrrolidine ring, an imidazolidine ring, a pyrazolidine ring, a piperidine ring, a piperazine ring, a morpholine ring, a pyran ring, an oxirane ring, an oxetane ring, a tetrahydrofuran ring, a tetrahydropyran ring, a dioxane ring, a thiirane ring, a thietane ring, a tetrahydrothiophene ring, and a tetrahydrothiopyran ring).

$R^{17}$ may further have the substituent T as long as the effects of the present invention are exhibited.

$R^{27}$ is the substituent T which will be described later, and n21 is an integer of 0 to 5. In a case where there are a plurality of $R^{27}$'s, $R^{27}$'s may be linked to each other to form a ring structure. Examples of the formed ring structure include examples of the ring Cf, the ring Cr, the ring Cn, the ring Co, and the ring Cs.

Examples of the substituent T include an alkyl group (the number of carbon atoms is preferably 1 to 24, more preferably 1 to 12, and still more preferably 1 to 6), an arylalkyl group (the number of carbon atoms is preferably 7 to 21, more preferably 7 to 15, and still more preferably 7 to 11), an alkenyl group (the number of carbon atoms is preferably 2 to 24, more preferably 2 to 12, and still more preferably 2 to 6), a hydroxyl group, an amino group ($-NR^N_2$) (the number of carbon atoms is preferably 0 to 24, more preferably 0 to 12, and still more preferably 0 to 6), a sulfanyl group, a carboxy group, an aryl group (the number of carbon atoms is preferably 6 to 22, more preferably 6 to 18, and still more preferably 6 to 10), an alkoxy group (the number of carbon atoms is preferably 1 to 12, more preferably 1 to 6, and still more preferably 1 to 3), an aryloxy group (the number of carbon atoms is preferably 6 to 22, more preferably 6 to 18, and still more preferably 6 to 10), an acyl group (the number of carbon atoms is preferably 2 to 12, more preferably 2 to 6, and still more preferably 2 or 3), an acyloxy group (the number of carbon atoms is preferably 2 to 12, more preferably 2 to 6, and still more preferably 2 or 3), an aryloyl group (the number of carbon atoms is preferably 7 to 23, more preferably 7 to 19, and still more preferably 7 to 11), an aryloyloxy group (the number of carbon atoms is preferably 7 to 23, more preferably 7 to 19, and still more preferably 7 to 11), a carbamoyl group (the number of carbon atoms is preferably 1 to 12, more preferably 1 to 6, and still more preferably 1 to 3), a sulfamoyl group (the number of carbon atoms is preferably 0 to 12, more preferably 0 to 6, and still more preferably 0 to 3), a sulfo group, a sulfoxy group, a phosphono group, a phosphonooxy group, an alkylsulfonyl group (the number of carbon atoms is preferably 1 to 12, more preferably 1 to 6, and still more preferably 1 to 3), an arylsulfonyl group (the number of carbon atoms is preferably 6 to 22, more preferably 6 to 18, and still more preferably 6 to 10), a heterocyclic group (at least one of an oxygen atom, a nitrogen atom, or a sulfur atom is contained; the number of carbon atoms is preferably 1 to 12, more preferably 1 to 8, and still more preferably 2 to 5; and a 5-membered ring or a 6-membered ring is preferably contained), a (meth)acryloyl group, a (meth)acryloyloxy group, a halogen atom (for example, a fluorine atom, a chlorine atom, a bromine atom, and an iodine atom), an oxo group (=O), an imino group (=$NR^N$), and an alkylidene group (=$C(R^N)_2$).

In addition, the substituent T also preferably includes a partial structure corresponding to a residue of the chelating agent, and more preferably has a ring structure of the chelating agent. The "residue of the chelating agent" is meant to include both a partial structure which retains a chelating action of a chelating agent which is a low-molecular-weight compound, and a partial structure which does not retain the chelating action, and is, for example, a partial structure in which some atoms are removed from the chelating agent, which is a low-molecular-weight compound, so as to retain the chelating action, a partial structure in which a ligand is removed from the chelating agent which is a low-molecular-weight compound, and a partial structure in which one atom at a terminal is removed from the chelating agent which is a low-molecular-weight compound. Consequently, compatibility between the high-molecular-weight compound and the chelating agent (in particular, the chelating agent which is a low-molecular-weight compound) is improved. Here, the partial structure may or may not have a chelating action.

$R^N$ is a hydrogen atom, an alkyl group of the substituent T, an alkenyl group of the substituent T, an aryl group of the substituent T, an arylalkyl group of the substituent T, or a heterocyclic group of the substituent T.

An alkyl moiety and an alkenyl moiety contained in each substituent may be chain-like or cyclic, or may be linear or branched. In a case where the substituent T is a group capable of taking a substituent, the substituent T may further have a substituent T. For example, a hydroxyalkyl group in which a hydroxyl group is substituted for an alkyl group may be mentioned.

Examples of the linking group L include an alkylene group (the number of carbon atoms is preferably 1 to 24, more preferably 1 to 12, and still more preferably 1 to 6), an alkenylene group (the number of carbon atoms is preferably 2 to 12, more preferably 2 to 6, and still more preferably 2 or 3), an (oligo)alkyleneoxy group (the number of carbon atoms in an alkylene group in one constitutional unit is preferably 1 to 12, more preferably 1 to 6, and still more preferably 1 to 3; and the repetition number is preferably 1 to 50, more preferably 1 to 40, and still more preferably 1 to 30), an arylene group (the number of carbon atoms is preferably 6 to 22, more preferably 6 to 18, and still more preferably 6 to 10), an oxygen atom, a sulfur atom, a sulfonyl group, a carbonyl group, a thiocarbonyl group, $-NR^N$, and a linking group related to a combination thereof. The alkylene group, alkenylene group, and alkyleneoxy group may have the substituent T. For example, the alkylene group may have a hydroxyl group.

A linking chain length of the linking group L is preferably 1 to 24, more preferably 1 to 12, and still more preferably 1 to 6. The linking chain length means the number of atoms positioned on the shortest path among the atomic groups involved in the linkage. For example, in a case of $-CH_2-C(=O)-O-$, the linking chain length is 3.

Furthermore, the alkylene group, alkenylene group, and (oligo)alkyleneoxy group as the linking group L, may be chain-like or cyclic, or may be linear or branched.

It is preferable that as an atom constituting the linking group L, a carbon atom, a hydrogen atom, and as necessary, a heteroatom (at least one kind selected from an oxygen atom, a nitrogen atom, or a sulfur atom, and the like) are included. The number of carbon atoms in the linking group is preferably 1 to 24, more preferably 1 to 12, and still more preferably 1 to 6. The number of hydrogen atoms may be determined according to the number of carbon atoms and the like. For each of the oxygen atom, the nitrogen atom, and the sulfur atom, the number of heteroatoms is preferably 0 to 12, more preferably 0 to 6, and still more preferably 0 to 3.

The high-molecular-weight compound may be synthesized by a conventional method. For example, for the synthesis of the polymer having the constitutional unit represented by Formula (1), a well-known method for addition polymerization of olefin can be appropriately adopted. For the synthesis of the polymer having the constitutional unit represented by Formula (2), a well-known method for addition polymerization of styrene can be appropriately adopted. For the synthesis of the polymer having the constitutional unit represented by Formula (3), a well-known method for synthesis of a phenol resin can be appropriately adopted.

A formulation amount of the high-molecular-weight compound is not particularly limited, but preferably accounts for a majority in the solid content in the composition for forming an underlayer film, and is more preferably 70% by mass or greater in the solid content and still more preferably 80% by mass or greater in the solid content. The upper limit thereof is not particularly limited, but is practically 99.0% by mass or less.

A content of the high-molecular-weight compound in the composition for forming an underlayer film (including a solvent) is not particularly limited, but is preferably 0.01% by mass or greater, more preferably 0.05% by mass or greater, and still more preferably 0.1% by mass or greater. The upper limit thereof is preferably 10% by mass or less, more preferably 5% by mass or less, still more preferably 1% by mass or less, and even more preferably less than 1% by mass.

One kind of the polymers may be used, or a plurality thereof may be used. In a case where the plurality thereof is used, the total amount thereof is within the above range.

<<Chelating Agent>>

The chelating agent is not particularly limited as long as the chelating agent is a compound which can be coordinately bonded to a metal component by a coordination site, and well-known chelating agents can be widely used. The chelating agent can be appropriately selected depending on a target metal component in the composition for forming an underlayer film. Examples of a metal component which is easily mixed in the composition for forming an underlayer film include iron, copper, titanium, aluminum, lead, sodium, potassium, calcium, magnesium, manganese, lithium, chromium, nickel, tin, zinc, arsenic, silver, gold, cadmium, cobalt, vanadium, and tungsten, and in particular, iron, copper, titanium, aluminum, and lead are easily mixed from an external environment, and thus are likely to contribute to damage to the mold. Therefore, in the selection of the chelating agent, it is preferable to target these metals, in particular, iron, copper, titanium, aluminum, and lead.

The chelating agent may be any one of a high-molecular-weight compound (molecular weight is 2,000 or greater) or a low-molecular-weight compound (molecular weight is less than 2,000). The chelating agent which is a high-molecular-weight compound is, for example, a resin having a moiety (which is a partial structure that retains a chelating action of the chelating agent which is a low-molecular-weight compound, and is hereinafter simply referred to as a "chelating moiety") corresponding to the chelating agent which is a low-molecular-weight compound. The chelating moiety may be anywhere in the resin, and is preferably at a terminal of a side chain or a main chain. The molecular weight of the chelating agent, which is a high-molecular-weight compound, is preferably 4,000 to 70,000. Meanwhile, the molecular weight of the chelating agent, which is a low-molecular-weight compound, is preferably 100 to 500. Moreover, the upper limit of the molecular weight is more preferably 400 or less, still more preferably 300 or less, and particularly preferably 250 or less. Furthermore, the lower limit of the molecular weight is more preferably 120 or greater, still more preferably 140 or greater, and particularly preferably 150 or greater. In a case where the molecular weight of the low-molecular-weight compound is within the above range, in the composition for forming an underlayer film, appropriate dispersibility and a sufficient coordination site of the chelating agent can be ensured, and metal components can be effectively captured.

The number of coordination sites of the chelating agent is not particularly limited. In the chelating agent which is a low-molecular-weight compound, the number of coordination sites per molecule is preferably 2 or more, and may be 3 or more or 4 or more.

The chelating agent, which is a low-molecular-weight compound, preferably corresponds to at least one aspect of an aspect of having an acid group (first aspect), an aspect of having a ring structure (second aspect), or an aspect of having a cyclic ligand (third aspect).

Regarding the first aspect, the acid group is preferably a carboxy group, a sulfonic acid group, a phenolic hydroxyl group, a phosphoric acid group, a thiocarboxylic acid group, or a dithiocarboxylic acid group. Among them, the acid group is preferably a carboxy group, a phenolic hydroxyl group, a sulfonic acid group, or a phosphoric acid group, more preferably a carboxy group or a phenolic hydroxyl group, and still more preferably includes a carboxy group. Moreover, the acid group may be two or more kinds selected from the above-exemplified functional groups, and in this case, the acid group may be a combination of the same kind of functional groups or a combination of different kinds of functional groups.

In a case where the chelating agent corresponds to the first aspect, the acid group usually serves as a coordination site in the chelating action. Moreover, regardless of the presence or absence of the formation of a chelate complex, after the composition for forming an underlayer film is dried, the chelating agent is likely to form a hydrogen bond with the polar group of the high-molecular-weight compound, improves the hardness of the underlayer film, and is less likely to diffuse into the curable composition applied onto the underlayer film. Furthermore, regardless of the presence or absence of the formation of a chelate complex, after the composition for forming an underlayer film is dried, the chelating agent is also likely to form a hydrogen bond with the polar group of the resin in the curable composition applied onto the underlayer film, and also improves the adhesiveness between the underlayer film and the curable composition.

Regarding the second aspect, the ring structure may be any one of an aliphatic ring, an aromatic ring, or a heterocyclic ring (having aromaticity and non-aromaticity). The ring structure may be monocyclic or polycyclic. In a case where the ring structure is polycyclic, the number of rings is preferably 10 or less, more preferably 5 or less, and still more preferably 4 or less, and may be 3.

In a case where the ring structure is an aliphatic ring or an aromatic ring, the other moiety bonded to the ring structure usually serves as a coordination site. For example, in this case, the chelating agent and the chelating moiety preferably have the acid group bonded to the ring structure, or a phosphine-based ligand. The aliphatic ring is preferably cycloalkane or cycloalkene having 4 to 20 carbon atoms. Here, the number of carbon atoms is more preferably 5 to 10 and still more preferably 5 to 7. In a case where the ring structure is an aromatic ring, the number of carbon atoms is preferably 6 to 20, more preferably 6 to 10, and still more preferably 6.

Meanwhile, in a case where the aromatic ring is a heterocyclic ring, a heteroelement (for example, an oxygen atom, a nitrogen atom, and a sulfur atom) in the heterocyclic ring serves as a coordination site. In particular, the heterocyclic ring preferably includes a nitrogen atom, more preferably has a pyridine skeleton, and still more preferably has two or more pyridine skeletons.

In a case where the chelating agent is a compound corresponding to the second aspect, by the high-molecular-weight compound having a ring structure (in particular, an aromatic ring), an effect of increasing the compatibility with the high-molecular-weight compound can be achieved.

Regarding the third aspect, as the cyclic ligand, for example, crown ether, porphyrin, triazacycloalkane, tetraazacycloalkane, and derivatives thereof can be adopted, and crown ether is particularly preferable. The crown ether is, for example, 12-crown-4, 15-crown-5, 18-crown-6, diaza-18-crown-6, and the like, and is more preferably 15-crown-5, 18-crown-6, and diaza-18-crown-6 and still more preferably 18-crown-6.

The chelating agent, which is a low-molecular-weight compound, also preferably corresponds to two or more of the first aspect to the third aspect, and particularly preferably corresponds to both the first aspect and the second aspect. Moreover, the chelating agent, which is a high-molecular-weight compound, also preferably corresponds to both the first aspect and the second aspect.

For example, it is preferable that such chelating agents have, as a ring structure A, cycloalkane having 5 to 10 carbon atoms, cycloalkene having 5 to 10 carbon atoms, or an aromatic ring having 6 to 10 carbon atoms, and have, as an acid group, at least one kind of a carboxy group, a sulfonic acid group, a phenolic hydroxyl group, or a phosphoric acid group.

Furthermore, such chelating agents each preferably contain, for example, a compound represented by Formula (CL1).

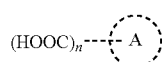

Formula (CL1)

In Formula (CL1), A represents a ring structure, and n represents an integer of 1 to 10. The ring structure has the same definition as the ring structure described in the second aspect. n is preferably 1 to 8, more preferably 1 to 4, and still more preferably 1 or 2.

For example, it is preferable that the compound represented by Formula (CL1) has, as the ring structure A, cycloalkane having 5 to 10 carbon atoms, cycloalkene having 5 to 10 carbon atoms, or an aromatic ring having 6 to 10 carbon atoms, and n is 1 to 4, and more preferable that the compound represented by Formula (CL1) has cycloalkene having 5 to 8 carbon atoms or a benzene ring, and n is 1 or 2.

A content of the chelating agent, which is a low-molecular-weight compound, is preferably 10 to 10,000 ppm by mass with respect to the solid content in the composition for forming an underlayer film. Moreover, the upper limit of the content is more preferably 10,000 ppm by mass or less and still more preferably 1,000 ppm by mass or less. Furthermore, the lower limit of the content is more preferably 10 ppm by mass or greater and still more preferably 100 ppm by mass or greater. The chelating agent may contain one kind of the aforementioned compounds alone, or may contain two or more kinds thereof. In a case where the chelating agent contains two or more kinds thereof, regarding the content, it is preferable that the total value thereof is within the above range.

Specific examples of the chelating agent, which is a low-molecular-weight compound, are shown below. However, in the present invention, the chelating agent is not limited to the following compounds. In the following formulae, Ph represents a phenyl group.

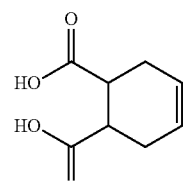

B-1

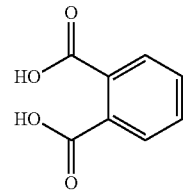

B-2

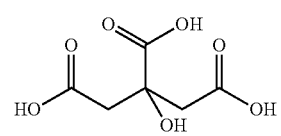

B-3

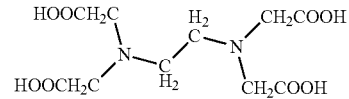

B-4

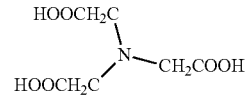

B-5

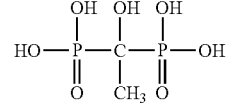

B-6

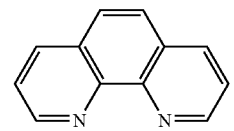

B-7

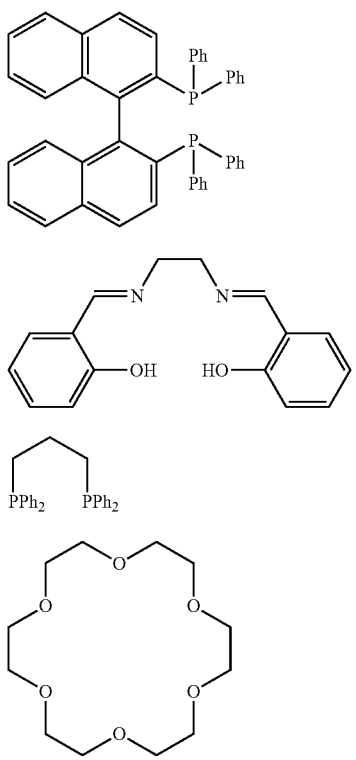

In addition, specifically, the chelating agent, which is a high-molecular-weight compound, is preferably a compound in which the chelating agents represented by B-1 to B-10 and the resin are linked to each other at a position that does not affect the chelating action, and the resin is preferably at least one kind of a (meth)acrylic resin or a novolac resin. In particular, it is preferable that the aforementioned high-molecular-weight compound having a polymerizable group has a chelating moiety together with the polymerizable group. In this case, the polymerizable group and the chelating moiety may be in the same repeating unit or different repeating units.

<<Solvent>>

The composition for forming an underlayer film contains a solvent (hereinafter, referred to as a "solvent for an underlayer film" in some cases). For example, the solvent is preferably a compound which is liquid at 23° C. and has a boiling point of 250° C. or lower. In general, the solid content finally forms an underlayer film. A content of the solvent for an underlayer film in the composition for forming an underlayer film is preferably 99.0% by mass or greater and more preferably 99.5% by mass or greater, and may be 99.6% by mass or greater. By setting the proportion of the solvent within the above range, a film thickness during film formation is kept thin, which leads to the improvement in pattern formability during etching processing.

Only one kind or two or more kinds of the solvents may be contained in the composition for forming an underlayer film. In a case where two or more kinds thereof are contained, the total amount thereof is preferably within the above range.

The boiling point of the solvent for an underlayer film is preferably 230° C. or lower, more preferably 200° C. or lower, still more preferably 180° C. or lower, even more preferably 160° C. or lower, and further still more preferably 130° C. or lower. The lower limit value thereof is practically 23° C. but more practically 60° C. or higher. By setting the boiling point within the above range, the solvent can be easily removed from the underlayer film, which is preferable.

The solvent for an underlayer film is preferably an organic solvent. The solvent is preferably a solvent having any one or more of an alkylcarbonyl group, a carbonyl group, a hydroxyl group, or an ether group. Among them, an aprotic polar solvent is preferably used.

As specific examples thereof, alkoxy alcohol, propylene glycol monoalkyl ether carboxylate, propylene glycol monoalkyl ether, lactate, acetate, alkoxypropionate, chain-like ketone, cyclic ketone, lactone, and alkylene carbonate are selected.

Examples of the alkoxy alcohol include methoxyethanol, ethoxyethanol, methoxypropanol (for example, 1-methoxy-2-propanol), ethoxypropanol (for example, 1-ethoxy-2-propanol), propoxypropanol (for example, 1-propoxy-2-propanol), methoxybutanol (for example, 1-methoxy-2-butanol and 1-methoxy-3-butanol), ethoxybutanol (for example, 1-ethoxy-2-butanol and 1-ethoxy-3-butanol), and methylpentanol (for example, 4-methyl-2-pentanol).

As the propylene glycol monoalkyl ether carboxylate, at least one selected from the group consisting of propylene glycol monomethyl ether acetate, propylene glycol monomethyl ether propionate, and propylene glycol monoethyl ether acetate is preferable, and propylene glycol monomethyl ether acetate (PGMEA) is particularly preferable.

In addition, as the propylene glycol monoalkyl ether, propylene glycol monomethyl ether (PGME) or propylene glycol monoethyl ether is preferable.

As the lactate, ethyl lactate, butyl lactate, or propyl lactate is preferable.

As the acetate, methyl acetate, ethyl acetate, butyl acetate, isobutyl acetate, propyl acetate, isoamyl acetate, methyl formate, ethyl formate, butyl formate, propyl formate, or 3-methoxybutyl acetate is preferable.

As the alkoxypropionate, methyl 3-methoxypropionate (MMP) or ethyl 3-ethoxypropionate (EEP) is preferable.

As the chain-like ketone, 1-octanone, 2-octanone, 1-nonanone, 2-nonanone, acetone, 4-heptanone, 1-hexanone, 2-hexanone, diisobutyl ketone, phenylacetone, methyl ethyl ketone, methyl isobutyl ketone, acetylacetone, acetonylacetone, ionone, diacetonyl alcohol, acetylcarbinol, acetophenone, methyl naphthyl ketone, or methyl amyl ketone is preferable.

As the cyclic ketone, methylcyclohexanone, isophorone, or cyclohexanone is preferable.

As the lactone, γ-butyrolactone (γBL) is preferable.

As the alkylene carbonate, propylene carbonate is preferable.

In addition to the aforementioned components, an ester-based solvent having 7 or more (preferably 7 to 14, more preferably 7 to 12, and still more preferably 7 to 10) carbon atoms and having 2 or less heteroatoms is preferably used.

Preferred examples of the ester-based solvent having 7 or more carbon atoms and 2 or less heteroatoms include amyl acetate, 2-methylbutyl acetate, 1-methylbutyl acetate, hexyl acetate, pentyl propionate, hexyl propionate, butyl propionate, isobutyl isobutyrate, heptyl propionate, and butyl butanoate, and isoamyl acetate is particularly preferably used.

In addition, a solvent having a flash point (hereinafter, also referred to as a p component) of 30° C. or higher is also preferably used. As such a component, propylene glycol monomethyl ether (p component: 47° C.), ethyl lactate (p component: 53° C.), ethyl 3-ethoxypropionate (p component: 49° C.), methyl amyl ketone (p component: 42° C.), cyclohexanone (p component: 30° C.), pentyl acetate (p component: 45° C.), methyl 2-hydroxyisobutyrate (p component: 45° C.), γ-butyrolactone (p component: 101° C.), or propylene carbonate (p component: 132° C.) is preferable. Among them, propylene glycol monoethyl ether, ethyl lactate, pentyl acetate, or cyclohexanone is more preferable, and propylene glycol monoethyl ether or ethyl lactate is particularly preferable.

Examples of a preferred solvent among the solvents for an underlayer film include alkoxy alcohol, propylene glycol monoalkyl ether carboxylate, propylene glycol monoalkyl ether, lactate, acetate, alkoxypropionate, chain-like ketone, cyclic ketone, lactone, and alkylene carbonate.

<<Acidic Compound Having pKa of 6 or Less>>

In the present invention, the composition for forming an underlayer film preferably contains an acidic compound having a pKa of 6 or less. Consequently, the acidic compound miniaturizes or ionizes the metal components in the composition to promote the formation of a chelate complex.

Moreover, in the acidic compound, the pKa of the acid is preferably 5.0 or less, more preferably 4.0 or less, and still more preferably 3.0 or less. The lower limit value thereof is more preferably −4.0 or greater and still more preferably −3.0 or greater. Consequently, the metal components in the composition can be effectively miniaturized or ionized.

In the present specification, the pKa of the acidic compound indicates a pKa in an aqueous solution, and is described in, for example, Chemical Handbook (II) (4th revised edition, 1993, edited by The Chemical Society of Japan, Maruzen Co., Ltd.), and the lower this value is, the greater the acid strength is. Specifically, the pKa in an aqueous solution can be actually measured by measuring an acid dissociation constant at 23° C. using an infinitely diluted aqueous solution. In a case where the actual measurement is not possible, a value based on the Hammett's substituent constant and the database of well-known literature values can also be determined by calculation using the following software package 1. All of the pKa values in the present specification indicate values determined by the calculation using this software package 1. Software package 1: Advanced Chemistry Development (ACD/Labs) Software V8.14 for Solaris (1994-2007 ACD/Labs).

The acidic compound may be an organic acid or an inorganic acid, and is preferably an organic acid. An acid group of the organic acid is preferably at least one kind of a carboxylic acid group, a sulfonic acid group, a phenolic hydroxyl group, a phosphoric acid group, a thiocarboxylic acid group, or a dithiocarboxylic acid group. Among them, the acid group is more preferably at least one kind of a carboxylic acid group, a phenolic hydroxyl group, a sulfonic acid group, or a phosphoric acid group, and still more preferably at least one kind of a carboxylic acid group, a sulfonic acid group, or a phenolic hydroxyl group. Moreover, the acidic compound preferably contains an aromatic ring, and in particular, the acidic compound is more preferably aromatic sulfonic acid. Specifically, the organic acid is preferably acetic acid, toluenesulfonic acid, and phenol. Meanwhile, examples of the inorganic acid include sulfuric acid, nitric acid, phosphoric acid, hydrochloric acid, and boric acid.

A molecular weight of the acidic compound is preferably 100 to 500. Moreover, the upper limit of the molecular weight is more preferably 400 or less, still more preferably 300 or less, and particularly preferably 250 or less. Furthermore, the lower limit of the molecular weight is more preferably 120 or greater, still more preferably 140 or greater, and particularly preferably 150 or greater. In a case where the molecular weight is within the above range, in the composition for forming an underlayer film, appropriate dispersibility of the acidic compound can be ensured, and thus the metal components can be effectively miniaturized or ionized.

A content of the acidic compound is preferably 0.01 to 100,000 ppm by mass with respect to the solid content in the composition for forming an underlayer film. Moreover, the upper limit of the content is more preferably 1,000 ppm by mass or less and still more preferably 100 ppm by mass or less. Furthermore, the lower limit of the content is more preferably 0.1 ppm by mass or greater, still more preferably 1 ppm by mass or greater, and particularly preferably 10 ppm by mass or greater. The acidic compound may contain one kind of the aforementioned compounds alone, or may contain two or more kinds thereof. In a case where the acidic compound contains two or more kinds thereof, regarding the content, it is preferable that the total value thereof is within the above range.

<<Other Components>>

The composition for forming an underlayer film may contain one or more kinds of an alkylene glycol compound, a polymerization initiator, a polymerization inhibitor, an antioxidant, a leveling agent, a thickener, a surfactant, or the like, in addition to the aforementioned components.

<<<Alkylene Glycol Compound>>>

The composition for forming an underlayer film may contain an alkylene glycol compound. The number of alkylene glycol constitutional units contained in the alkylene glycol compound is preferably 3 to 1,000, more preferably 4 to 500, still more preferably 5 to 100, and even more preferably 5 to 50. A weight-average molecular weight (Mw) of the alkylene glycol compound is preferably 150 to 10,000, more preferably 200 to 5,000, still more preferably 300 to 3,000, and even more preferably 300 to 1,000.

Examples of the alkylene glycol compound include polyethylene glycol, polypropylene glycol, mono- or di-methyl ether thereof, mono- or di-octyl ether, mono- or di-nonyl ether, mono- or di-decyl ether, monostearate, monooleate, monoadipate, and monosuccinate, and polyethylene glycol and polypropylene glycol are preferable.

Surface tension of the alkylene glycol compound at 23° C. is preferably 38.0 mN/m or higher and more preferably 40.0 mN/m or higher. The upper limit of the surface tension is not particularly specified, but is, for example, 48.0 mN/m or lower. By formulating such a compound, the wettability of the curable composition for imprinting provided immediately above the underlayer film can be further improved.

The surface tension is measured at 23° C. using a surface tensiometer SURFACE TENS-IOMETER CBVP-A3 manufactured by Kyowa Interface Science Co., LTD. and a glass plate. The unit is mN/m. Two samples are produced for one level and are respectively measured three times. An arithmetic mean value of a total of six times is adopted as an evaluation value.

In a case where the alkylene glycol compound is contained, the content thereof is 40% by mass or less, preferably 30% by mass or less, more preferably 20% by mass or less, and still more preferably 1% to 15% by mass, with respect to the solid content. The alkylene glycol compound may be used alone or in combination of two or more kinds thereof. In a case where two or more kinds thereof are used, the total amount thereof is preferably within the above range.

<<<Polymerization Initiator>>>

The composition for forming an underlayer film may contain a polymerization initiator and preferably contains at least one kind of a thermal polymerization initiator or a photopolymerization initiator. By containing the polymerization initiator, a reaction of a polymerizable group contained in the composition for forming an underlayer film is promoted, and thus the adhesiveness tends to be improved. From the viewpoint that crosslinking reactivity with the curable composition for imprinting is improved, a photopolymerization initiator is preferable. As the photopolymerization initiator, a radical polymerization initiator and a cationic polymerization initiator are preferable, and a radical polymerization initiator is more preferable. Moreover, in the present invention, a plurality of kinds of photopolymerization initiators may be used in combination.

As the thermal polymerization initiator, the respective components described in JP2013-036027A, JP2014-090133A, and JP2013-189537A can be used. Also regarding the content or the like, reference can be made to the descriptions in the aforementioned publications.

As a radical polymerization initiator, well-known compounds can be optionally used. Examples thereof include a halogenated hydrocarbon derivative (for example, a compound having a triazine skeleton, a compound having an oxadiazole skeleton, a compound having a trihalomethyl group, and the like), an acylphosphine compound such as acylphosphine oxide, hexaarylbiimidazole, an oxime compound such as an oxime derivative, an organic peroxide, a thio compound, a ketone compound, an aromatic onium salt, ketoxime ether, an aminoacetophenone compound, hydroxyacetophenone, an azo-based compound, an azide compound, a metallocene compound, an organic boron compound, and an iron arene complex. For the details thereof, reference can be made to the description in paragraphs 0165 to 0182 of JP2016-027357A, the contents of which are incorporated in the present specification.

Examples of the acylphosphine compound include 2,4,6-trimethylbenzoyl-diphenyl-phosphine oxide. Moreover, IRGACURE-819, IRGACURE 1173, and IRGACURE-TPO (trade names: all are produced by BASF SE), which are commercially available products, can be used.

In a case where the photopolymerization initiator used in the composition for forming an underlayer film is formulated, a content thereof in the solid content is, for example, 0.0001% to 5% by mass, preferably 0.0005% to 3% by mass, and more preferably 0.01% to 1% by mass. In a case where two or more kinds of photopolymerization initiators are used, the total amount thereof is within the above range.

<Method for Producing Composition for Forming Underlayer Film>

The composition for forming an underlayer film according to the embodiment of the present invention is prepared by formulating raw materials in a predetermined ratio. The raw materials refer to components which are actively formulated in the composition for forming an underlayer film, and in which unintentionally contained components such as impurities are excluded. Specifically, a curable component and a solvent are exemplified. Here, the raw materials may be commercially available products or synthetic products. All the raw materials may contain impurities such as metal particles.

As one preferred embodiment of a method for producing the composition for forming an underlayer film according to the embodiment of the present invention, a producing method including subjecting at least one kind of raw materials contained in the composition for forming an underlayer film to a filtration treatment with a filter can be mentioned. Moreover, it is also preferable that two or more kinds of raw materials are mixed, then filtered with a filter, and mixed with other raw materials (may or may not be filtered). As one more preferred embodiment thereof, an embodiment in which raw materials (preferably, all raw materials) contained in the composition for forming an underlayer film are mixed, and then subjected to a filtration treatment with a filter is exemplified.

Effects of filtration are exhibited even with one stage of a filter, but filtration with two or more stages of filters is more preferable. The filtration with two or more stages of filters refers to filtration in a state where two or more filters are arranged in series. In the present invention, filtration with one to five stages of filters is preferable, filtration with one to four stages of filters is more preferable, and filtration with two to four stages of filters is still more preferable.

<Surface Free Energy of Underlayer Film>

Surface free energy of an underlayer film for imprinting which is formed of the composition for forming an underlayer film according to the embodiment of the present invention is preferably 30 mN/m or greater, more preferably 40 mN/m or greater, and still more preferably 50 mN/m or greater. The upper limit thereof is preferably 200 mN/m or greater, more preferably 150 mN/m or greater, and still more preferably 100 mN/m or greater.

The surface free energy can be measured at 23° C. using a surface tensiometer SURFACE TENS-IOMETER CBVP-A3 manufactured by Kyowa Interface Science Co., LTD. and a glass plate.

<Curable Composition for Imprinting>

The composition for forming an underlayer film according to the embodiment of the present invention is usually used as a composition for forming an underlayer film for the curable composition for imprinting. The composition or the like of the curable composition for imprinting is not particularly specified, but the curable composition for imprinting preferably contains a polymerizable compound.

<<Polymerizable Compound>>

The curable composition for imprinting preferably contains a polymerizable compound, and it is more preferable that the polymerizable compound constitutes the maximum-amount component. The polymerizable compound may have one polymerizable group or two or more polymerizable groups in one molecule. At least one kind of polymerizable compounds contained in the curable composition for imprinting preferably has two to five polymerizable groups, more preferably has two to four polymerizable groups, still more preferably has two or three polymerizable groups, and even more preferably has three polymerizable groups, in one molecule.

At least one kind of polymerizable compounds contained in the curable composition for imprinting preferably has a ring structure. Examples of this ring structure include the aliphatic hydrocarbon ring Cf and the aromatic hydrocarbon ring Cr. Among them, the polymerizable compound preferably has the aromatic hydrocarbon ring Cr and more preferably has a benzene ring.

The molecular weight of the polymerizable compound is preferably 100 to 900.

The at least one kind of polymerizable compounds is preferably represented by Formula (I-1).

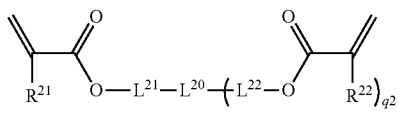
(I-1)

$L^{20}$ is a (1+q2)-valent linking group, and examples thereof include a linking group having a ring structure. Examples of the ring structure include examples of the ring Cf, the ring Cr, the ring Cn, the ring Co, and the ring Cs.

$R^{21}$ and $R^{22}$ each independently represent a hydrogen atom or a methyl group.

$L^{21}$ and $L^{22}$ each independently represent a single bond or the linking group L. $L^{20}$ and $L^{21}$ or $L^{22}$ may be bonded to each other via or without via the linking group L to form a ring. $L^{20}$, $L^{21}$, and $L^{22}$ may have the substituent T. A plurality of substituents T may be bonded to each other to form a ring. In a case where there are the plurality of substituents T, the plurality of substituents T may be the same as or different from each other.

q2 is an integer of 0 to 5, preferably an integer of 0 to 3, more preferably an integer of 0 to 2, and still more preferably 0 or 1.

Examples of the polymerizable compound include compounds used in the following Examples, the compounds described in paragraphs 0017 to 0024 and Examples of JP2014-090133A, the compounds described in paragraphs 0024 to 0089 of JP2015-009171A, the compounds described in paragraphs 0023 to 0037 of JP2015-070145A, and the compounds described in paragraphs 0012 to 0039 of WO2016/152597A, but the present invention is not construed as being limited thereto.

The content of the polymerizable compound in the curable composition is preferably 30% by mass or greater, more preferably 45% by mass or greater, still more preferably 50% by mass or greater, and even more preferably 55% by mass or greater, and may be 60% by mass or greater or further 70% by mass or greater. Moreover, the upper limit value thereof is preferably less than 99% by mass and more preferably 98% by mass or less, and can also be 97% by mass or less.

It is preferable that the boiling point of the polymerizable compound is set based on a relationship with the high-molecular-weight compound contained in the aforementioned composition for forming an underlayer film and designed for formulation. The boiling point of the polymerizable compound is preferably 500° C. or lower, more preferably 450° C. or lower, and still more preferably 400° C. or lower. The lower limit value thereof is preferably 200° C. or higher, more preferably 220° C. or higher, and still more preferably 240° C. or higher.

<<Other Components>>

The curable composition may contain additives other than the polymerizable compound. A polymerization initiator, a solvent, a surfactant, a sensitizer, a release agent, an antioxidant, a polymerization inhibitor, and the like may be contained as other additives.

Specific examples of the curable composition which can be used in the present invention include the compositions described in JP2013-036027A, JP2014-090133A, and JP2013-189537A, the contents of which are incorporated in the present specification. Moreover, also regarding preparation of the curable composition and a pattern producing method, reference can be made to the descriptions in the aforementioned publications, the contents of which are incorporated in the present specification.

In the present invention, a content of the solvent in the curable composition is preferably 5% by mass or less, more preferably 3% by mass or less, and still more preferably 1% by mass or less with respect to the curable composition.

The curable composition can also adopt an aspect in which a polymer (which has preferably a weight-average molecular weight of greater than 1,000 and more preferably a weight-average molecular weight of greater than 2,000) is not substantially contained. The expression "polymer is not substantially contained" means, for example, that the content of the polymer is 0.01% by mass or less with respect to the curable composition, and it is preferable that the content is 0.005% by mass or less and more preferable that the polymer is not contained at all.

<Physical Property Value or the Like>

A viscosity of the curable composition is preferably 20.0 mPa·s or lower, more preferably 15.0 mPa·s or lower, still more preferably 11.0 mPa·s or lower, and even more preferably 9.0 mPa·s or lower. The lower limit value of the viscosity is not particularly limited, but can be, for example, 5.0 mPa·s or higher. The viscosity is measured according to the following method.

The viscosity is measured using an E-type rotational viscometer RE85L manufactured by TOKI SANGYO CO., LTD. and a standard cone rotor (1° 34'×R24) in a state where a temperature of a sample cup is adjusted to 23° C. The unit is mPa·s. Other details regarding the measurement are in accordance with JIS Z 8803:2011. Two samples are produced for one level and are respectively measured three times. An arithmetic mean value of a total of six times is adopted as an evaluation value.

Surface tension (γResist) of the curable composition is preferably 28.0 mN/m or higher and more preferably 30.0 mN/m or higher, and may be 32.0 mN/m or higher. By using the curable composition which has high surface tension, a capillary force is increased and thus high-speed filling of a mold pattern with the curable composition is possible. The upper limit value of the surface tension is not particularly limited, but from the viewpoints of a relationship with the underlayer film and imparting ink jet suitability, is preferably 40.0 mN/m or lower and more preferably 38.0 mN/m or lower, and may be 36.0 mN/m or lower.

The surface tension of the curable composition is measured according to the same method as the measuring method for the alkylene glycol compound.

An Ohnishi parameter of the curable composition is preferably 5.0 or less, more preferably 4.0 or less, and still more preferably 3.7 or less. The lower limit value of the Ohnishi parameter of the curable composition is not particularly specified, but may be, for example, 1.0 or greater or further 2.0 or greater.

For each of the solid contents of the curable composition, the Ohnishi parameter can be determined by substituting the number of carbon atoms, the number of hydrogen atoms, and the number of oxygen atoms in all constituent components into the following expression.

Ohnishi parameter=sum of number of carbon atoms, number of hydrogen atoms, and number of oxygen atoms/(number of carbon atoms−number of oxygen atoms)

<Storage Container>

As a storage container of the composition for forming an underlayer film and the curable composition used in the present invention, storage containers well known in the related art can be used. Moreover, as the storage container, for the purpose of suppressing impurities from being mixed into a raw material or a composition, a multilayer bottle having a container inner wall made of six layers of six kinds of resins or a bottle having a seven-layer structure of six kinds of resins is also preferably used. Examples of such a container include the container described in JP2015-123351A.

<Kit for Imprinting>

A kit according to the embodiment of the present invention includes the curable composition for forming a pattern (cured film with a transferred pattern) for imprinting, and a composition for forming an underlayer film, which is for forming an underlayer film for imprinting. By using the kit according to the embodiment of the present invention, imprinting capable of suppressing damage to the mold can be performed.

<Pattern Producing Method>

A pattern (cured film with a transferred pattern) producing method according to the preferred embodiment of the present invention includes: a step (underlayer film formation step) of forming an underlayer film on a surface of a substrate using the composition for forming an underlayer film according to the embodiment of the present invention; a step (curable composition layer formation step) of applying the curable composition onto the underlayer film (preferably, a surface of the underlayer film) to form a curable composition layer; a step of bringing a mold into contact with the curable composition layer; a step of exposing the curable composition layer in a state of being in contact with a mold; and a step of peeling off the mold from the exposed curable composition layer.

In the pattern producing method according to the embodiment of the present invention, the composition for forming an underlayer film is preferably preserved at 10° C. to 40° C. before being applied onto the substrate. The upper limit of the numerical range is more preferably 35° C. or lower and still more preferably 33° C. or lower. Moreover, the lower limit of the numerical range is more preferably 15° C. or higher and still more preferably 18° C. or higher. Consequently, the activity of the chelating agent can be sufficiently exerted.

Specific preservation methods other than the temperature are not particularly limited. For example, the composition can also be preserved under the atmosphere and can also be preserved under the atmosphere of a replacement gas such as nitrogen, and it is preferable to preserve the composition under the atmosphere. Moreover, the composition can also be preserved in a storage warehouse with a light shielding window, and may be preserved in a state of being mounted on an apparatus such as an imprint device.

Hereinafter, the pattern producing method will be described with reference to FIGS. 1A to 1G. It goes without saying that the configuration of the present invention is not limited by the drawings.

<<Underlayer Film Formation Step>>

Figure 1B:
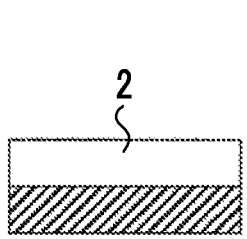

In the underlayer film formation step, as shown in FIGS. 1A and 1B, an underlayer film 2 is formed on a surface of a substrate 1. The underlayer film is preferably formed by applying the composition for forming an underlayer film in a layer form onto the substrate. The substrate 1 may have an undercoat layer or an adhesive layer in addition to a case where the substrate 1 consists of a single layer.

A method for applying the composition for forming an underlayer film onto the surface of the substrate is not particularly specified, and generally well-known application methods can be adopted. Specific examples of the application method include a dip coating method, an air knife coating method, a curtain coating method, a wire bar coating method, a gravure coating method, an extrusion coating method, a spin coating method, a slit scanning method, and an ink jet method, and a spin coating method is preferable.

Furthermore, after the composition for forming an underlayer film is applied in a layer form onto the substrate, preferably, the solvent is volatilized (dried) by heat to form an underlayer film which is a thin film.

A thickness of the underlayer film 2 is preferably 2 nm or greater, more preferably 3 nm or greater, and still more preferably 4 nm or greater, and may be 5 nm or greater, 7 nm or greater, or 10 nm or greater. Moreover, the thickness of the underlayer film is preferably 40 nm or less, more preferably 30 nm or less, and still more preferably 20 nm or less, and may be 15 nm or less. By setting the film thickness to be equal to or greater than the lower limit value, extendibility (wettability) of the curable composition on the underlayer film is improved, and a uniform residual film can be formed after imprinting. By setting the film thickness to be equal to or less than the upper limit value, the thickness of the residual film after imprinting is reduced, the film thickness unevenness is less likely to occur, and thus uniformity of the residual film tends to be improved.

A material of the substrate is not particularly specified, and reference can be made to the description in paragraph 0103 of JP2010-109092A, the contents of which are incorporated in the present specification. In the present invention, a silicon substrate, a glass substrate, a quartz substrate, a sapphire substrate, a silicon carbide substrate, a gallium nitride substrate, an aluminum substrate, an amorphous aluminum oxide substrate, a polycrystalline aluminum oxide substrate, and a substrate made of spin-on carbon (SOC), spin-on glass (SOG), silicon nitride, silicon oxynitride, GaAsP, GaP, AlGaAs, InGaN, GaN, AlGaN, ZnSe, AlGa, InP, or ZnO can be mentioned. Furthermore, specific examples of a material of the glass substrate include aluminosilicate glass, aluminoborosilicate glass, and barium borosilicate glass. In the present invention, a silicon substrate and a substrate coated with spin-on carbon (SOC) are preferable.

As the silicon substrate, a surface-modified silicon substrate can be appropriately used, and a silicon substrate in which the carbon content in the region from the surface of the substrate to the thickness of 10 nm (more preferably, the thickness of 100 nm) is 70% by mass or greater (preferably, 80% to 100% by mass) may be used. Examples thereof include a substrate which has a spin-on carbon (SOC) film having a film thickness of 200 nm and is obtained by applying various spin-on carbon films onto a silicon substrate by a spin coating method and performing baking at 240° C. for 60 seconds. In recent years, stable mold patterning has been required even on the surfaces of such various SOC substrates, and according to the present invention, favorable adhesiveness between such a substrate and a layer formed of a curable composition can be ensured, and stable mold patterning without substrate peeling is achieved.

In the present invention, it is preferable to use a substrate having an organic layer as an outermost layer.

Examples of the organic layer of the substrate include an amorphous carbon film formed by chemical vapor deposition (CVD), and a spin-on carbon film formed by dissolving a high-carbon material in an organic solvent and performing spin coating. Examples of the spin-on carbon film include a nortricyclene copolymer, a hydrogenated naphthol novolac resin, a naphthol dicyclopentadiene copolymer, a phenol dicyclopentadiene copolymer, the fluorene bisphenol novolac described in JP2005-128509A, the acenaphthylene copolymer described in JP2005-250434A, an indene copolymer, the fullerene having a phenol group described in JP2006-227391A, a bisphenol compound and a novolac resin thereof, a dibisphenol compound and a novolac resin thereof, a novolac resin of an adamantane phenol compound, a hydroxyvinylnaphthalene copolymer, the bisnaphthol compound and the novolac resin thereof described in JP2007-199653A, and resin compounds shown in ROMP and a tricyclopentadiene copolymerized substance.

For examples of the SOC, reference can be made to the description in paragraph 0126 of JP2011-164345A, the contents of which are incorporated in the present specification.

A contact angle of the surface of the substrate to water is preferably 20° or larger, more preferably 40° or larger, and still more preferably 60° or larger. The upper limit thereof is practically 90° or smaller. The contact angle is measured according to a method described in Example described later.

In the present invention, it is preferable to use a substrate (hereinafter, referred to as a basic substrate) having a basic layer as an outermost layer. Examples of the basic substrate include a substrate containing a basic organic compound (for example, an amine-based compound, an ammonium-based compound, or the like), and an inorganic substrate containing a nitrogen atom.

<<Curable Composition Layer Formation Step>>

Figure 1C:
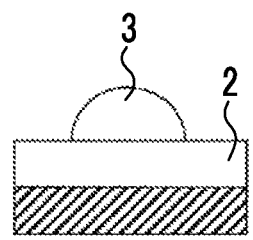

In this step, for example, as shown in FIG. 1C, a curable composition 3 is applied onto the surface of the underlayer film 2.

A method for applying the curable composition is not particularly specified, and reference can be made to the description in paragraph 0102 of JP2010-109092A (the publication number of the corresponding US application is US2011/183127A), the contents of which are incorporated in the present specification. The curable composition is preferably applied onto the surface of the underlayer film by an ink jet method. Moreover, the curable composition may be applied through multiple applying. In a method for arranging liquid droplets on the surface of the underlayer film by the ink jet method or the like, an amount of the liquid droplets is preferably about 1 to 20 pL, and the liquid droplets are preferably arranged on the surface of the underlayer film at an interval between liquid droplets. The interval between liquid droplets is preferably an interval of 10 to 1,000 μm. In a case of the ink jet method, the interval between liquid droplets is an arrangement interval between ink jet nozzles.

Furthermore, a volume ratio of the underlayer film 2 to the film-like curable composition 3 applied onto the underlayer film is preferably 1:1 to 500, more preferably 1:10 to 300, and still more preferably 1:50 to 200.

In addition, a method for manufacturing a laminate is a method for manufacturing a laminate using a kit including a curable composition and a composition for forming an underlayer film, and includes applying the curable composition onto a surface of an underlayer film formed of the composition for forming an underlayer film. Moreover, it is preferable that the method for manufacturing a laminate includes a step of applying the composition for forming an underlayer film in a layer form onto a substrate, and includes heating (baking) the composition for forming an underlayer film, which has been applied in a layer form, preferably at 100° C. to 300° C., more preferably at 130° C. to 260° C., and still more preferably at 150° C. to 230° C. A heating time is preferably 30 seconds to 5 minutes.

In a case where the curable composition is applied to the underlayer film, an aspect in which a liquid film is formed on the substrate may be adopted. The liquid film may be formed by a conventional method. For example, the liquid film may be formed by applying, onto a substrate, a composition containing a crosslinkable monomer (examples thereof include examples of the polymerizable compound), which is liquid at 23° C., and the like.

<<Mold Contact Step>>

Figure 1D:
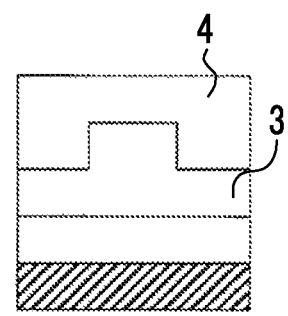

In the mold contact step, for example, as shown in FIG. 1D, the curable composition 3 is brought into contact with a mold 4 having a pattern for transferring a pattern shape. Through such a step, a desired pattern (imprint pattern) is obtained.

Specifically, in order to transfer a desired pattern to the film-like curable composition, the mold 4 is brought into press contact with the surface of the film-like curable composition 3.

The mold may be a light-transmitting mold or a non-light-transmitting mold. In a case where the light-transmitting mold is used, it is preferable that the curable composition 3 is irradiated with light from a mold side. In the present invention, it is more preferable that the light-transmitting mold is used and light is radiated from the mold side.

A mold, which can be used in the present invention, is a mold having a pattern to be transferred. The pattern of the mold can be formed according to a desired processing accuracy, for example, by photolithography, an electron beam drawing method, or the like, but in the present invention, a mold pattern forming method is not particularly limited. Moreover, a pattern formed by the pattern producing method according to the preferred embodiment of the present invention can also be used as a mold.

A material constituting the light-transmitting mold used in the present invention is not particularly limited, but examples thereof include glass, quartz, a light-transmitting resin such as polymethyl methacrylate (PMMA) and a polycarbonate resin, a transparent metal vapor-deposited film, a flexible film such as polydimethylsiloxane, a photo-cured film, and a metal film, and quartz is preferable.

A non-light-transmission-type mold material used in a case where a light-transmitting substrate is used in the present invention is not particularly limited, but may be any material having a predetermined strength. Specific examples thereof include a ceramic material, a vapor-deposited film, a magnetic film, a reflective film, a substrate made of a metal such as Ni, Cu, Cr, and Fe, and a substrate made of SiC, silicon, silicon nitride, polysilicon, silicon oxide, or amorphous silicon, but there is no particular restriction.

The surface of the substrate may be appropriately treated by a conventional method, and for example, an aspect in which the adhesiveness is further improved by forming an OH group on the surface of the substrate by a UV ozone treatment or the like to increase polarity of the surface of the substrate may be adopted.

In the pattern producing method, in a case where imprint lithography is performed using the curable composition, mold pressure is preferably set to 10 atm or lower. By setting the mold pressure to 10 atm or lower, the mold or the substrate is less likely to be deformed and thus the pattern accuracy tends to be improved. Moreover, also from the viewpoint that a device tends to be reduced in size due to low pressure, the above range is preferable. The mold pressure is preferably selected from a range in which uniformity of mold transfer can be ensured while the residual film of the curable composition corresponding to a projection part of the mold is reduced.

In addition, it is also preferable that the contact between the curable composition and the mold is performed under an atmosphere containing a helium gas, a condensable gas, or both a helium gas and a condensable gas.

<<Light Irradiation Step>>

In the light irradiation step, the curable composition is irradiated with light to form a cured substance. An irradiation dose of light irradiation in the light irradiation step may be sufficiently larger than the minimum irradiation dose required for curing. The irradiation dose required for curing is appropriately determined by examining consumption of an unsaturated bond of the curable composition or the like. A kind of light to be radiated is not particularly specified, but ultraviolet light is exemplified.

In addition, in the imprint lithography applied to the present invention, a temperature of the substrate during light irradiation is usually room temperature, but in order to increase reactivity, light irradiation may be performed while heating. Since setting a vacuum state as a stage prior to the light irradiation is effective in preventing air bubbles from being mixed, suppressing a decrease in reactivity due to oxygen mixing, and improving adhesiveness between the mold and the curable composition, the light irradiation may be performed in a vacuum state. Moreover, in the pattern producing method, a preferred degree of vacuum during the light irradiation is in a range of $10^{-1}$ Pa to normal pressure.

During exposure, exposure illuminance is preferably in a range of 1 to 500 mW/cm$^2$ and more preferably in a range of 10 to 400 mW/cm$^2$. An exposure time is not particularly limited, but is preferably 0.01 to 10 seconds and more preferably 0.5 to 1 second. An exposure amount is preferably in a range of 5 to 1,000 mJ/cm$^2$ and more preferably in a range of 10 to 500 mJ/cm$^2$.

In the pattern producing method, after the film-like curable composition (pattern forming layer) is cured by the light irradiation, as necessary, a step of applying heat to the cured pattern to further cure the pattern may be included. A temperature for heating and curing the curable composition after the light irradiation is preferably 150° C. to 280° C. and more preferably 200° C. to 250° C. Moreover, a time for applying heat is preferably 5 to 60 minutes and more preferably 15 to 45 minutes.

<<Release Step>>

Figure 1E:
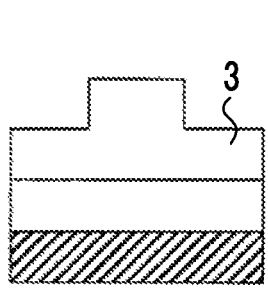

In the release step, the cured substance and the mold are separated from each other (FIG. 1E). The obtained pattern can be used for various uses as described later. That is, the present invention discloses a laminate further having the pattern formed of the curable composition, on the surface of the underlayer film. Moreover, a film thickness of the pattern forming layer consisting of the curable composition used in the present invention varies depending on intended uses, but is about 0.01 µm to 30 µm. Furthermore, as described later, etching or the like can also be performed.

<Pattern and Application Thereof>

The pattern formed by the pattern producing method can be used as a permanent film used in a liquid crystal display device (LCD) or the like, or an etching resist (mask for lithography) for manufacturing a semiconductor element. In particular, the present specification discloses a method for manufacturing a semiconductor device (circuit board), which includes a step of obtaining a pattern by the pattern producing method according to the preferred embodiment of the present invention. The method for manufacturing a semiconductor device according to the preferred embodiment of the present invention may further include a step of performing etching or ion implantation on the substrate using the pattern obtained by the pattern producing method as a mask and a step of forming an electronic member. The semiconductor device is preferably a semiconductor element. That is, the present specification discloses a method for manufacturing a semiconductor device, which includes the pattern producing method. Moreover, the present specification discloses a method for manufacturing an electronic apparatus, which includes a step of obtaining a semiconductor device by the method for manufacturing a semiconductor device and a step of connecting the semiconductor device and a control mechanism for controlling the semiconductor device.

In addition, a grid pattern is formed on a glass substrate of the liquid crystal display device using the pattern formed by the pattern producing method, and thus a polarizing plate having low reflection or absorption and a large screen size (for example, 55 inches or 60 inches (1 inch is 2.54 centimeters)) can be manufactured at low cost. For example, the polarizing plate described in JP2015-132825A or WO2011/132649A can be manufactured.

Figure 1F:
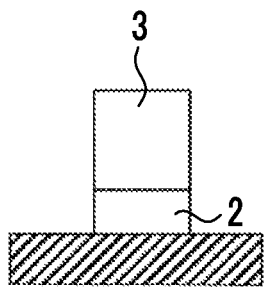
Figure 1G:

The pattern formed in the present invention is also useful as an etching resist (mask for lithography) as shown in FIGS. 1F and 1G. In a case where the pattern is used as an etching resist, first, a fine pattern of, for example, a nano or micron order is formed on the substrate by the pattern producing method. In the present invention, the pattern producing method is particularly advantageous in that a fine pattern of a nano order can be formed, and a pattern having a size of 50 nm or less and particularly 30 nm or less can also be formed. The lower limit value of the size of the pattern formed by the pattern producing method is not particularly specified, but can be, for example, 1 nm or greater.

Furthermore, the present invention also discloses a method for manufacturing a mold for imprinting, which includes a step of obtaining a pattern on the substrate by the pattern producing method according to the preferred embodiment of the present invention and a step of etching the substrate using the obtained pattern.

By performing etching with an etching gas such as hydrogen fluoride or the like in a case of wet etching and $CF_4$ or the like in a case of dry etching, a desired pattern can be formed on the substrate. The pattern has favorable etching resistance particularly to dry etching. That is, the pattern formed by the pattern producing method is preferably used as a mask for lithography.

Specifically, the pattern formed in the present invention can be preferably used for producing a recording medium such as a magnetic disc, a light-receiving element such as a solid-state imaging element, a light emitting element such as a light emitting diode (LED) and organic electroluminescence (organic EL), an optical device such as a liquid crystal display device (LCD), an optical component such as a diffraction grating, a relief hologram, an optical waveguide, an optical filter, and a microlens array, a member for flat panel display such as a thin film transistor, an organic transistor, a color filter, an antireflection film, a polarizing plate, a polarizing element, an optical film, and a column material, a nanobiodevice, an immunoassay chip, a deoxyribonucleic acid (DNA) separation chip, a microreactor, a photonic liquid crystal, or a guide pattern for fine pattern formation (directed self-assembly, DSA) using self-assembly of block copolymers.

EXAMPLES

Hereinafter, the present invention will be described in more detail with reference to Examples. The materials, the used amounts, the ratios, the treatment details, the treatment procedures, and the like shown in the following Examples can be appropriately modified without departing from the spirit of the present invention. Therefore, the scope of the present invention is not limited to the specific examples described below. The Examples were carried out under a condition of 23° C., unless otherwise specified.

<Preparation of Composition for Forming Underlayer Film>

Respective materials were formulated and mixed so as to satisfy each of formulation ratios (% by mass) shown in Tables 1 to 3 below. After the mixing, the mixture was dissolved in propylene glycol monomethyl ether acetate to produce a 0.3% by mass solution. The solution was filtered with a nylon filter having a pore diameter of 0.02 μm and an ultra-high-molecular-weight polyethylene (UPE) filter having a pore diameter of 0.001 μm to prepare compositions for forming an underlayer film shown in Examples and Comparative Examples. Moreover, the contents of the chelating agent and the acidic compound are each expressed in terms of a content (ppm by mass) with respect to the total solid content in the composition.

Furthermore, a water content of the composition for forming an underlayer film of each of Examples and Comparative Examples was measured using the Karl Fischer method. For each composition, the water content was less than 0.1% by mass with respect to the total amount of the composition.

TABLE 1

| | | Example 1 | Example 2 | Example 3 | Example 4 | Example 5 | Example 6 | Example 7 | Example 8 | Example 9 | Example 10 |
|---|---|---|---|---|---|---|---|---|---|---|---|
| High-molecular-weight compound | A-1 | 0.3 | 0.3 | 0.3 | 0.3 | 0.3 | 0.3 | 0.3 | 0.3 | 0.3 | 0.3 |
| | A-2 | | | | | | | | | | |
| | A-3 | | | | | | | | | | |
| | A-4 | | | | | | | | | | |
| | A-5 | | | | | | | | | | |
| | A-6 | | | | | | | | | | |
| Chelating agent (ppm by mass) | B-1 | 100 | | | | | | | | | 20,000 |
| | B-2 | | | | | | | | | | |
| | B-3 | | | | | 100 | | | | | |
| | B-4 | | | | | | 100 | | | | |
| | B-5 | | | | | | | 100 | | | |
| | B-6 | | | | | | | | 100 | | |
| | B-7 | | 100 | | | | | | | | |
| | B-8 | | | | | | | | | 100 | |
| | B-9 | | | | | | | | | | |
| | B-10 | | | 100 | | | | | | | |
| | B-11 | | | | 100 | | | | | | |
| Acidic compound (ppm by mass) | D-1 | | | | | | | | | | |
| | D-2 | | | | | | | | | | |
| | D-3 | | | | | | | | | | |
| Solvent | PGMEA | 99.7 | 99.7 | 99.7 | 99.7 | 99.7 | 99.7 | 99.7 | 99.7 | 99.7 | 99.7 |
| | PGME | | | | | | | | | | |
| | GBL | | | | | | | | | | |
| Total (parts by mass) | | 100 | 100 | 100 | 100 | 100 | 100 | 100 | 100 | 100 | 100 |
| Curable composition | | V1 | V1 | V1 | V1 | V1 | V1 | V1 | V1 | V1 | V1 |
| Heating temperature | | 220 | 220 | 220 | 220 | 220 | 220 | 220 | 220 | 220 | 220 |
| Film thickness (nm) | | 5 | 5 | 5 | 5 | 5 | 5 | 5 | 5 | 5 | 5 |
| Mold durability | | A | B | B | A | A | A | A | A | B | C |
| Adhesive force | | A | A | B | B | A | B | A | B | B | C |
| Coating defects | | A | B | B | A | A | A | A | A | A | C |
| Coated surface condition | | A | A | C | C | A | A | A | B | C | C |
| Peeling defects | | A | C | C | A | B | B | B | B | A | C |

* The contents of the chelating agent and the acidic compound are each a content (ppm by mass) with respect to the total solid content in the composition.

TABLE 2

| | | Example 11 | Example 12 | Example 13 | Example 14 | Example 15 | Example 16 | Example 17 | Example 18 | Example 19 | Example 20 |
|---|---|---|---|---|---|---|---|---|---|---|---|
| High-molecular-weight compound | A-1 | 1.5 | 0.3 | 0.3 | | | 0.3 | 0.3 | | 0.3 | 0.3 |
| | A-2 | | | | | | | | | | |
| | A-3 | | | | | 0.3 | | | | | |
| | A-4 | | | | | | | | 0.3 | | |
| | A-5 | | | | 0.3 | | | | | | |
| | A-6 | | | | | | | | | | |
| Chelating agent (ppm by mass) | B-1 | 100 | 100 | 100 | 100 | 100 | 100 | 100 | 100 | | |
| | B-2 | | | | | | | | | 100 | |
| | B-3 | | | | | | | | | | |
| | B-4 | | | | | | | | | | |
| | B-5 | | | | | | | | | | |
| | B-6 | | | | | | | | | | |
| | B-7 | | | | | | | | | | |
| | B-8 | | | | | | | | | | |

TABLE 2-continued

|  |  | Example 11 | Example 12 | Example 13 | Example 14 | Example 15 | Example 16 | Example 17 | Example 18 | Example 19 | Example 20 |
|---|---|---|---|---|---|---|---|---|---|---|---|
|  | B-9 |  |  |  |  |  |  |  |  |  | 100 |
|  | B-10 |  |  |  |  |  |  |  |  |  |  |
|  | B-11 |  |  |  |  |  |  |  |  |  |  |
| Acidic compound (ppm by mass) | D-1 |  | 100 |  |  |  |  |  |  |  |  |
|  | D-2 |  |  | 100 |  |  |  |  |  |  |  |
|  | D-3 |  |  |  | 100 |  |  |  |  |  |  |
| Solvent | PGMEA | 98.5 | 99.7 | 99.7 | 99.7 | 99.7 | 99.7 | 99.7 | 99.7 | 99.7 | 99.7 |
|  | PGME |  |  |  |  |  |  |  |  |  |  |
|  | GBL |  |  |  |  |  |  |  |  |  |  |
| Total (parts by mass) |  | 100 | 100 | 100 | 100 | 100 | 100 | 100 | 100 | 100 | 100 |
| Curable composition |  | V1 | V1 | V1 | V1 | V1 | V1 | V1 | V1 | V1 | V1 |
| Heating temperature |  | 220 | 220 | 220 | 220 | 220 | 220 | 220 | 220 | 220 | 220 |
| Film thickness (nm) |  | 5 | 5 | 5 | 5 | 5 | 5 | 5 | 5 | 5 | 5 |
| Mold durability |  | A | B | B | A | B | A | A | A | A | A |
| Adhesive force |  | A | A | B | B | B | A | A | A | A | B |
| Coating defects |  | A | A | A | A | A | A | A | A | A | A |
| Coated surface condition |  | C | A | A | A | A | A | A | A | A | A |
| Peeling defects |  | B | A | A | A | C | A | A | A | A | C |

* The contents of the chelating agent and the acidic compound are each a content (ppm by mass) with respect to the total solid content in the composition.

TABLE 3

|  |  | Example 21 | Example 22 | Example 23 | Example 24 | Example 25 | Comparative Example 1 | Comparative Example 2 | Comparative Example 3 |
|---|---|---|---|---|---|---|---|---|---|
| High-molecular-weight compound | A-1 | 0.3 | 0.3 | 0.3 | 0.3 | 0.3 | 0.3 |  |  |
|  | A-2 |  |  |  |  |  |  | 0.3 |  |
|  | A-3 |  |  |  |  |  |  |  |  |
|  | A-4 |  |  |  |  |  |  |  |  |
|  | A-5 |  |  |  |  |  |  |  |  |
|  | A-6 |  |  |  |  |  |  |  | 0.3 |
| Chelating agent (ppm by mass) | B-1 |  |  |  |  |  | 0 | 0 |  |
|  | B-2 | 100 | 100 | 100 | 100 | 100 |  |  |  |
|  | B-3 |  |  |  |  |  |  |  |  |
|  | B-4 |  |  |  |  |  |  |  |  |
|  | B-5 |  |  |  |  |  |  |  |  |
|  | B-6 |  |  |  |  |  |  |  |  |
|  | B-7 |  |  |  |  |  |  |  |  |
|  | B-8 |  |  |  |  |  |  |  |  |
|  | B-9 |  |  |  |  |  |  |  |  |
|  | B-10 |  |  |  |  |  |  |  |  |
|  | B-11 |  |  |  |  |  |  |  |  |
| Acidic compound (ppm by mass) | D-1 |  |  |  |  |  |  |  |  |
|  | D-2 |  |  |  |  |  |  |  |  |
|  | D-3 |  |  |  |  |  |  |  |  |
| Solvent | PGMEA | 79.7 | 79.7 |  | 99.7 | 99.7 | 99.7 | 99.7 | 99.7 |
|  | PGME | 20 |  | 79.7 |  |  |  |  |  |
|  | GBL |  | 20 | 20 |  |  |  |  |  |
| Total (parts by mass) |  | 100 | 100 | 100 | 100 | 100 | 100 | 100 | 100 |
| Curable composition |  | V1 | V1 | V1 | V1 | V1 | V1 | V2 | V1 |
| Heating temperature |  | 220 | 220 | 220 | 250 | 220 | 220 | 220 | 220 |
| Film thickness (nm) |  | 5 | 5 | 5 | 5 | 10 | 5 | 5 | 5 |
| Mold durability |  | A | A | A | A | A | D | D | D |
| Adhesive force |  | A | A | A | A | B | A | B | B |
| Coating defects |  | A | A | A | A | A | D | D | A |
| Coated surface condition |  | A | A | A | A | A | D | D | A |
| Peeling defects |  | A | A | A | A | A | D | D | D |

* The contents of the chelating agent and the acidic compound are each a content (ppm by mass) with respect to the total solid content in the composition.

The specific specifications of each raw material are as follows.

<Raw Material of Composition for Forming Underlayer Film>

<<High-Molecular-Weight Compound>>

A-1: Compound having the following structure (NK OLIGO EA-7440, produced by SHIN-NAKAMURA CHEMICAL CO, LTD., and Mw=4,000)

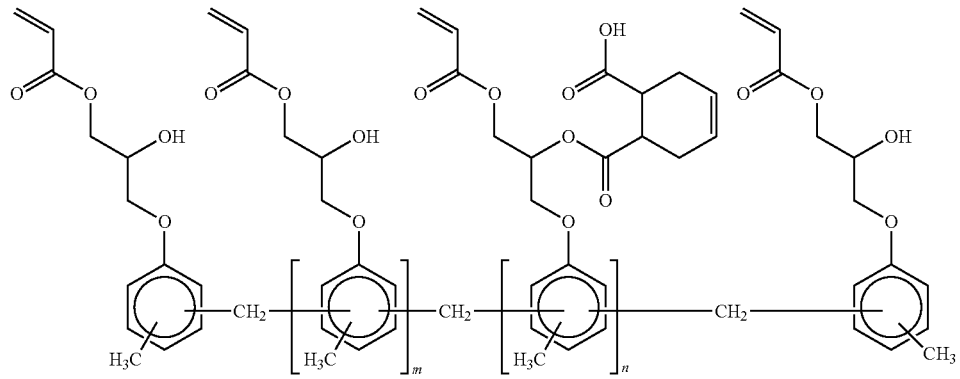

Average m + n = 11, Average n/(m + n) = 0.5

A-2: Compound containing the following repeating unit (ISORAD501, produced by Schenectady International, Inc.)

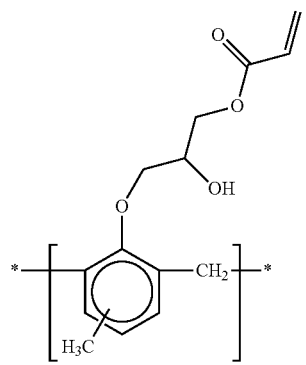

A-3: Compound containing the following repeating unit (PVEEA, produced by NIPPON SHOKUBAI CO., LTD., and Mw=20,000)

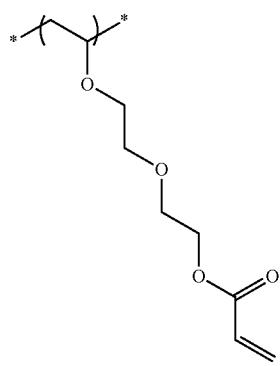

A-4: Compound containing the following repeating unit (Mw=20,000 and the synthesis method thereof will be described later)

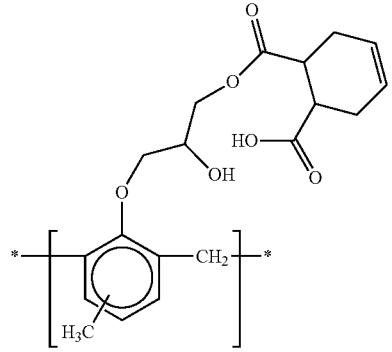

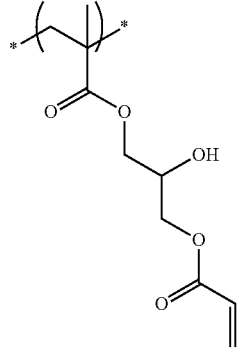

A-5: Compound containing the following repeating unit (Mw=20,000 and the synthesis method thereof will be described later)

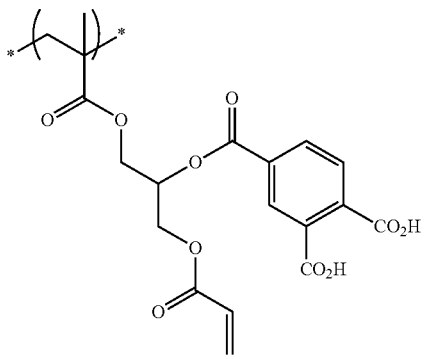

A-6: Compound containing the following repeating unit (Mw=2,200 to 3,300, n=10 to 15, and the synthesis method thereof will be described later)

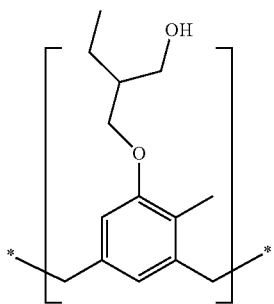

<<Chelating Agent>>
B-1 to B-11: B-1 to B-11 described above, respectively.
<<Solvent>>
PGMEA: Propylene glycol monomethyl ether acetate
PGME: Propylene glycol monomethyl ether
GBL: γ-butyrolactone
<<Acidic Compound>>
D-1: Compound having the following structure (pKa: −3)

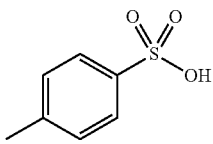

D-2: Boric acid (pKa: 9)
D-3: Acetic acid (pKa: 4)
<<Method for Synthesizing High-Molecular-Weight Compound A-4>>

100 g of PGMEA as a solvent was placed in a flask, and a temperature of the PGMEA was raised to 90° C. under a nitrogen atmosphere. A liquid mixture of glycidyl methacrylate (GMA, 28.4 g, and 0.2 mol), an azo-based polymerization initiator (V-601, produced by FUJIFILM Wako Pure Chemical Corporation, 2.8 g, and 12 mmol), and PGMEA (50 g) was added dropwise to this solvent over 2 hours. After completion of the dropwise addition, the liquid mixture was stirred at 90° C. for 4 hours. Thereafter, acrylic acid (19.0 g, 0.26 mol, 1.1 equivalents with respect to GMA, and produced by FUJIFILM Wako Pure Chemical Corporation), tetrabutylammonium bromide (TBAB and 2.1 g), and 4-hydroxy-2,2,6,6-tetramethylpiperidine-1-oxyl (4-HO-TEMPO and 50 mg) were added in this order to the container, and reacted while stirring at 90° C. for 8 hours. It was confirmed by H-NMR measurement that a glycidyl group disappeared by the reaction. By the aforementioned procedures, a PGMEA solution of a high-molecular-weight compound A-4 was obtained. For the obtained high-molecular-weight compound A-4, the Mw was 20,000 and the dispersity (Mw/Mn) was 1.9.

<<Method for Synthesizing High-Molecular-Weight Compound A-5>>

Triethylamine (21.3 g and 0.21 mol) was added to the PGMEA solution of the high-molecular-weight compound A-4 obtained above, anhydrous trimellitic acid chloride (43.0 g and 0.21 mol) was then added, and stirring was performed at 40° C. for 4 hours. Subsequently, hydrochloric acid (100 g and concentration of 1 mol/L) was added to the obtained solution, and stirring was performed at 30° C. for 2 hours to obtain a PGMEA solution of a high-molecular-weight compound A-5. For the obtained high-molecular-weight compound A-5, the Mw was 20,000 and the dispersity (Mw/Mn) was 2.0.

<<Method for Synthesizing High-Molecular-Weight Compound A-6>>

11 g of EPON Resin 164 and 100 mL of dimethyl ether (DME) were mixed at room temperature to prepare a first solution, which was cooled to −20° C. Next, 50 mmol of ethylmagnesium bromide (EtMgBr) was dissolved in 50 mL of DME to prepare a second solution, the second solution was added to the first solution, and then stirring was performed for 6 hours. Then, the reaction was then stopped by adding 5 mL of water to the first solution. Moreover, the first temperature was returned to room temperature, water was removed, then acrylic acid chloride (450 mg and 5 mmol) and trimethylamine (10 mmol) were added to the first solution, and the reaction mixture was stirred for 2 hours. Solid matter was removed through filtration, and then filtrate was vacuum-dried. A product was redissolved in 200 ml of diethyl ether, a potassium carbonate solid (10 g) was added to this solution, and the remaining acid was absorbed while stirring for 4 hours. Thereafter, solid matter was removed through filtration, and filtrate was vacuum-dried to obtain a compound A-6.

<Preparation of Curable Composition>

Preparation was performed by formulating respective materials so as to satisfy formulation ratios (parts by mass) shown in the following table, and further adding 4-hydroxy-2,2,6,6-tetramethylpiperidine-1-oxyl free radical (manufactured by Tokyo Chemical Industry Co., Ltd.) as a polymerization inhibitor so that the amount thereof was 200 ppm by mass (0.02% by mass) with respect to the total amount of polymerizable compounds. The resultant was filtered with a nylon filter having a pore diameter of 0.02 μm and a UPE filter having a pore diameter of 0.001 μm to prepare curable compositions V1 and V2. In the table, k+m+n is 10.

TABLE 4

| Curable composition V1 | Formulation ratio (parts by mass) |
|---|---|
| 1,3-bis(acryloyloxymethyl)benzene | 65 |
| Dodecyl acrylate ($C_{12}H_{25}O$-acrylate) | 20 |
| Neopentyl glycol diacrylate | 15 |
| Bis(2,4,6-trimethylbenzoyl)phenylphosphine oxide | 2 |
| 2-Hydroxy-2-methyl-1-phenylpropan-1-one | 2 |
| $H_3CO(C_3H_6O)_k$-CH[$(OC_3H_6)_mOCH_3$]-CH$_2$-$(OC_3H_6)_nOCH_3$ | 3 |

| Curable composition V2 | Formulation ratio (parts by mass) |
|---|---|
| 1,6-Hexanediol diacrylate | 50 |
| Benzyl acrylate | 40 |
| Isobornyl acrylate | 10 |
| Fluorine-based surfactant (Capstone FS-3100, produced by DuPont) | 1 |

TABLE 4-continued

| | |
|---|---|
| Ethyl (2,4,6-trimethylbenzoyl)phenylphosphinate | 2 |
| 2-Hydroxy-2-methyl-1-phenylpropan-1-one | 2 |

<Formation of Underlayer Film and Measurement of Film Thickness>

A silicon wafer having a contact angle to water of 50° or larger was spin-coated with the composition for forming an underlayer film of each of Examples and Comparative Examples, and heated using a hot plate under the temperature conditions shown in Tables 1 to 3 to form an underlayer film on the silicon wafer. The film thickness of the underlayer film was measured with an ellipsometer and an atomic force microscope.

<Evaluation>

For the composition for forming an underlayer film of each of Examples and Comparative Examples obtained above, the following items were evaluated.

<<Evaluation of Durability of Mold>>
<Evaluation of Mold Durability>

As the mold, a quartz mold with a 1:1 line and space pattern having a line width of 20 nm and a depth of 55 nm was used. Coordinates of 500 places in the mold where defects (mask defects) did not exist in 1 μm square were grasped in advance using a mask defect review scanning electron microscope (SEM) device E5610 (manufactured by ADVANTEST CORPORATION). A curable composition for imprinting was applied onto the underlayer film produced above by the ink jet method using an ink jet printer DMP-2831 manufactured by FUJIFILM Dimatix Inc., and then the curable composition was sandwiched between the silicon wafer and the mold under a helium atmosphere. Subsequently, exposure was performed from the mold side using a high-pressure mercury lamp under a condition of 100 mJ/cm$^2$, and then the quartz mold was released to obtain a pattern.

Moreover, the imprint process was repeated 100 times, then the mold was recovered, it was checked whether or not defects in the mold were generated at the 500 places, and evaluation was performed according to the following standards.

A: The generation of defects in the mold was not observed.
B: The number of places where defects in the mold were observed was less than 5.
C: The number of places where defects in the mold were observed was 5 or more and less than 25.
D: The number of places where defects in the mold were observed was 25 or more.

<<Evaluation of Adhesive Force>>

The curable composition V1 or V2 for imprinting whose temperature was adjusted to 25° C. was jetted in a liquid droplet amount of 6 pl per nozzle to the surface of the underlayer film obtained above using an ink jet printer DMP-2831 manufactured by FUJIFILM Dimatix Inc., and liquid droplets were applied onto the underlayer film in a square array with intervals of about 100 μm, thereby forming a pattern forming layer. Subsequently, a quartz wafer spin-coated with the composition for forming an adhesive layer described in Example 6 of JP2014-024322A was pressed against the pattern forming layer under a He atmosphere (substitution rate of 90% or greater) to imprint the curable composition. When 10 seconds passed after the imprinting, exposure was performed from the quartz wafer side using a high-pressure mercury lamp under a condition of 150 mJ/cm$^2$. A force required for peeling off the sample after exposure was measured, and was defined as an adhesive force F of the underlayer film. Moreover, the value of F was evaluated according to the following standards.

A: F≥30N
B: 25N≤F<30N
C: 20 N≤F<25 N
D: F<20N

<<Evaluation of Coating Defects>>

A silicon wafer having a diameter of 300 mm was prepared, and particles having a diameter of 50 nm or greater and present on the wafer were detected by a device (SP-5 manufactured by KLA-Tencor Corporation) for detecting defects on the surface of the wafer. This is used as an initial value. Subsequently, the silicon wafer was spin-coated with the composition for forming an underlayer film of each of Examples and Comparative Examples, and heated using a hot plate under the temperature conditions shown in Tables 1 to 3 to form an underlayer film on the silicon wafer. Next, the number of defects was measured in the same manner as above. This is used as a measured value. Moreover, a difference (measured value−initial value) between the initial value and the measured value was calculated. The obtained results were evaluated based on the following standards, and the results thereof are shown in Tables 1 to 3.

A: For the number of defects, the difference between the initial value and the measured value was 20 or less.
B: For the number of defects, the difference between the initial value and the measured value was 21 to 100.
C: For the number of defects, the difference between the initial value and the measured value was 101 to 500.
D: For the number of defects, the difference between the initial value and the measured value was 501 or more.

<<Evaluation of Coated Surface Condition>>

The surface unevenness data of the underlayer film obtained above were measured at a pitch of 1,024×1,024 in a region of 10 μm square using an atomic force microscope (AFM, and Dimension Icon manufactured by Bruker AXS), and an arithmetic mean surface roughness (Ra) was calculated. Moreover, regarding this surface roughness (Ra), a coated surface condition of the underlayer film was evaluated according to the following standards.

A: 0 nm≤Ra<0.8 nm
B: 0.8 nm≤Ra<1.6 nm
C: 1.6 nm≤Ra<5.0 nm
D: 5.0 nm≤Ra

<<Evaluation of Peeling Defects>>

The curable composition V1 or V2 whose temperature was adjusted to 25° C. was jetted in a liquid droplet amount of 6 pl per nozzle to the surface of the underlayer film obtained above using an ink jet printer DMP-2831 manufactured by FUJIFILM Dimatix Inc., and liquid droplets were applied onto the underlayer film in a square array with intervals of about 100 μm, thereby forming a pattern forming layer. Subsequently, a quartz mold (line pattern with a line width of 28 nm and a depth of 60 nm) was pressed against the pattern forming layer under a He atmosphere (substitution rate of 90% or greater) to fill the mold with the curable composition. When 10 seconds passed after the imprinting, exposure was performed from a mold side using a high-pressure mercury lamp under a condition of 150 mJ/cm$^2$, and then the mold was peeled off to transfer a pattern to the pattern forming layer. The presence or absence of peeling of the transferred pattern was checked by optical microscope observation (macro-observation) and scanning electron microscope observation (micro-observation), and evaluation was performed based on the following standards.

A: Pattern peeling was not observed.
B: In the macro-observation, pattern peeling was not observed, but in the micro-observation, pattern peeling was observed.
C: In the macro-observation, peeling was observed in some regions (release end part).
D: None of A to C were applicable.

<Evaluation Result>

The evaluation results of the respective Examples and Comparative Examples are shown in Tables 1 to 3. From the results, it was found that damage to the mold during use can be suppressed by using the composition for forming an underlayer film according to the embodiment of the present invention containing the chelating agent. Furthermore, according to the present invention, it was also found that the composition for forming an underlayer film contributes to a reduction in particles and the improvement in the coated surface condition, after the application of the composition.

In addition, the underlayer film was formed on the silicon wafer using the composition for forming an underlayer film according to each Example, and a predetermined pattern corresponding to a semiconductor circuit was formed on the silicon wafer with the underlayer film using the curable composition according to each Example. Moreover, each silicon wafer was etched by using this pattern as an etching mask, and each semiconductor element was produced using this silicon wafer. There was no problem with the performance of any of the semiconductor elements.

EXPLANATION OF REFERENCES

1: substrate
2: underlayer film
3: curable composition for imprinting
4: mold

What is claimed is:

1. A composition for forming an underlayer film for imprinting, comprising:
   a high-molecular-weight compound having a polymerizable group;
   a chelating agent; and
   a solvent,
   wherein the chelating agent has an acid group; the acid group includes a carboxy group; and a content of the chelating agent is 10 to 10,000 ppm by mass with respect to the solids content in the composition.

2. The composition for forming an underlayer film according to claim 1,
   wherein the chelating agent has a ring structure.

3. The composition for forming an underlayer film according to claim 1,
   wherein a molecular weight of the chelating agent is 100 to 500.

4. The composition for forming an underlayer film according to claim 1,
wherein the chelating agent contains a compound represented by Formula (CL1),

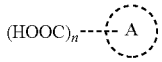　Formula (CL1)

in Formula (CL1), A represents a ring structure, and n represents an integer of 1 to 10.

5. The composition for forming an underlayer film according to claim 1,
wherein a content of the solvent is 99.0% by mass or greater with respect to the composition.

6. The composition for forming an underlayer film according to claim 1, further comprising:
an acidic compound having a pKa of 6 or less, other than the chelating agent.

7. The composition for forming an underlayer film according to claim 6,
wherein the acidic compound other than the chelating agent is aromatic sulfonic acid.

8. The composition for forming an underlayer film according to claim 1,
wherein the high-molecular-weight compound has a partial structure corresponding to a residue of the chelating agent.

9. The composition for forming an underlayer film according to claim 1,
wherein the high-molecular-weight compound has a polar group.

10. A method for producing the composition for forming an underlayer film for imprinting of claim 1, comprising:
filtering a composition, which contains a high-molecular-weight compound having a polymerizable group, a chelating agent, and a solvent, with a filter,
wherein the chelating agent has an acid group; the acid group includes a carboxy group; and a content of the chelating agent is 10 to 10,000 ppm by mass with respect to the solids content in the composition.

11. A kit for imprinting, comprising:
the composition for forming an underlayer film according to claim 1; and
a curable composition.

12. A pattern producing method comprising:
forming an underlayer film on a substrate by using the composition for forming an underlayer film according to claim 1;
applying a curable composition onto the underlayer film;
curing the curable composition in a state of being in contact with a mold; and
peeling off the mold from the curable composition.

13. The pattern producing method according to claim 12,
wherein the forming of the underlayer film includes applying the composition for forming an underlayer film onto the substrate by a spin coating method.

14. The pattern producing method according to claim 12,
wherein preserving the composition for forming an underlayer film at 10° C. to 40° C. before application onto the substrate is included.

15. The pattern producing method according to claim 12,
wherein the application of the curable composition onto the underlayer film is performed by an ink jet method.

16. A method for manufacturing a semiconductor element,
wherein a semiconductor element is manufactured using a pattern obtained by the producing method according to claim 12.

* * * * *